(12) United States Patent
Stevens et al.

(10) Patent No.: US 8,036,854 B2
(45) Date of Patent: Oct. 11, 2011

(54) COMMUNICATION OF A DIAGNOSTIC SIGNAL AND A FUNCTIONAL SIGNAL BY AN INTEGRATED CIRCUIT

(75) Inventors: Ashley Miles Stevens, Cambridge (GB); Sheldon James Woodhouse, Lincolnshire (GB); Daren Croxford, Cambridgeshire (GB); Edmond John Simon Ashfield, Cambridge (GB)

(73) Assignee: ARM Limited, Cambridge (GB)

( * ) Notice: Subject to any disclaimer, the term of this patent is extended or adjusted under 35 U.S.C. 154(b) by 149 days.

(21) Appl. No.: 11/984,678

(22) Filed: Nov. 20, 2007

(65) Prior Publication Data
US 2008/0162071 A1     Jul. 3, 2008

(30) Foreign Application Priority Data

Dec. 27, 2006  (GB) .................................. 0625958.4
Sep. 21, 2007  (GB) .................................. 0718601.8

(51) Int. Cl.
*G06F 11/30*     (2006.01)
*G01R 31/28*     (2006.01)

(52) U.S. Cl. ....................... 702/183; 714/724

(58) Field of Classification Search .................. 702/183, 702/182, 186, 57, 64–73, 79, 81, 84, 122, 702/190, 189; 714/E11.2, E11.201, E11.202, 714/E11.203, E11.205, E11.207, E11.208, 714/E11.21, E11.217, 724, 25, 27, 30, 31, 714/37, 725, 731, 733, 734, 744; 324/765; 340/2.1, 2.28, 2.29, 3.1, 3.2, 146.2, 514, 340/531, 657–659, 661

See application file for complete search history.

(56) References Cited

U.S. PATENT DOCUMENTS

| 5,317,711 | A | * | 5/1994 | Bourekas et al. ............... 714/47 |
| 5,418,452 | A | * | 5/1995 | Pyle ........................... 324/158.1 |
| 5,488,688 | A | * | 1/1996 | Gonzales et al. ............... 714/34 |
| 5,953,273 | A |   | 9/1999 | Ikegami ........................ 365/201 |
| 5,956,477 | A | * | 9/1999 | Ranson et al. .................. 714/30 |
| 5,991,910 | A |   | 11/1999 | Hull et al. ...................... 714/733 |
| 6,075,396 | A |   | 6/2000 | Amerian et al. .............. 327/198 |
| 6,076,175 | A |   | 6/2000 | Drost et al. .................... 714/704 |

(Continued)

FOREIGN PATENT DOCUMENTS
EP         0 840 220         5/1998
(Continued)

OTHER PUBLICATIONS

D. Pajak, "System Solutions for a Baseband SoC" Design & Reuse, 2006.
R. Bannatyne, "Debugging Aids for Systems-on-a-Chip" IEEE, 1998, pp. 107-111.

(Continued)

*Primary Examiner* — Michael Nghiem
*Assistant Examiner* — Toan Le
(74) *Attorney, Agent, or Firm* — Nixon & Vanderhye P.C.

(57) ABSTRACT

An integrated circuit 300 includes a functional circuit 310 and a diagnostic circuit 330. The integrated circuit includes a signal interface controller 320 operable to monitor a signal associated with at least one of the functional circuit and the diagnostic circuit to control selective communication of a diagnostic signal and a functional signal for communication across a signal interface in dependence upon the monitored signal. A further integrated circuit has a signal interface providing a communication path and communicates a functional signal having at least one multi-bit value in which at least one bit is replaced by data of a diagnostic signal.

8 Claims, 17 Drawing Sheets

U.S. PATENT DOCUMENTS

| | | | |
|---|---|---|---|
| 6,466,007 B1 | 10/2002 | Prazeres da Costa et al. | 324/158.1 |
| 6,800,817 B2 | 10/2004 | Schneider et al. | 714/773 |
| 6,834,367 B2 | 12/2004 | Bonneau et al. | 714/738 |
| 7,076,420 B1 * | 7/2006 | Snyder et al. | 703/28 |
| 7,089,467 B2 | 8/2006 | Burch | 714/724 |
| 7,143,312 B1 | 11/2006 | Wang et al. | 714/30 |
| 7,187,192 B2 | 3/2007 | Oshima et al. | 324/765 |
| 7,330,502 B2 | 2/2008 | Hotta | 375/221 |
| 7,444,546 B2 * | 10/2008 | Kimelman et al. | 714/31 |
| 7,496,813 B1 * | 2/2009 | Houlihane et al. | 714/724 |
| 7,526,692 B2 * | 4/2009 | Borkenhagen et al. | 714/724 |
| 2004/0148553 A1 | 7/2004 | Nalbantis | 714/726 |
| 2006/0156113 A1 | 7/2006 | Whetsel | 714/724 |
| 2006/0279308 A1 | 12/2006 | Ong | 324/765 |

FOREIGN PATENT DOCUMENTS

| | | |
|---|---|---|
| EP | 0 969 290 | 1/2000 |
| WO | 93/04427 | 3/1993 |

OTHER PUBLICATIONS

B. Vermeulen et al, "Design for Debug: Catching Design Errors in Digital Chips" IEEE May 2002, pp. 37-45.

E. Moerman et al, "Debug architecture for System on Chip taking full advantage of the Test Access Port" *Proceedings of the Eight IEEE European Test Workshop (ETW'03)* 2003.

R. Dees, "Application Note AN2298/D Rev. 0.1, Feb. 2003, Nexus Interface Connector Options for MPC56x Devices" 2004, pp. 1-19.

M. Klingensmith, Digital System Debug Techniques *Wescon—IC EXPO*, Nov. 1997, pp. 98-120.

European Search Report dated Apr. 27, 2007.

A. Burdass et al, "Embedded Test and Debug of Full Custom and Synthesisable Microprocessor Cores" IEEE European Test Workshop, May 23-26, 2000.

Official Action mailed Mar. 26, 2009 in U.S. Appl. No. 11/289,640.

Notice of Allowance mailed Oct. 15, 2008 in U.S. Appl. No. 11/289,640.

"Integrator LM-XCV600E+ User Guide" 2000-2001, http://arm.com/.

UK Search Report dated May 3, 2011 for GB 1106140.5.

* cited by examiner

US 8,036,854 B2

COMMUNICATION OF A DIAGNOSTIC SIGNAL AND A FUNCTIONAL SIGNAL BY AN INTEGRATED CIRCUIT

BACKGROUND OF THE INVENTION

1. Field of the Invention

This invention relates to the field of integrated circuits. More particularly, this invention relates to the communication of diagnostic signals to or from an integrated circuit.

2. Description of the Prior Art

It is known to provide integrated circuits with on-chip diagnostic capabilities. These capabilities can include debug, trace, calibration, configuration, production test and/or in-circuit programming. As integrated circuits increase in complexity such that more and more functional components are included in an ever decreasing circuit area, the provision of on-chip diagnostic mechanisms becomes increasingly useful and important.

A problem arising with integrated circuits is associated with limitations imposed by the integrated circuit packaging (due to ever decreasing circuit area) upon the number of integrated circuit pins provided. The increasing complexity of functional components of integrated circuits gives rise to a corresponding increase in the required number of circuit pins for communicating signals to and from the integrated circuit during normal operation. However, it is difficult to increase the number of pins provided on the circuit given that space is limited.

Integrated circuits typically generate large amounts of diagnostic information such as trace information. This diagnostic information is typically sent off-chip for processing. On-chip trace buffers can store small amounts of trace information and/or help smooth out trace data peaks generated by the integrated circuit. Furthermore, the trace information can be compressed to help reduce the bandwidth requirements. However, despite the provision of trace data buffering and trace data compression the amount of trace data that is generated can still be very large.

A known technique for communicating diagnostic signals to and from an integrated circuit is to provide dedicated trace and/or debug pins on the integrated circuit package through which the diagnostic signals may pass. One example of such an arrangement would be the Test Access Port pins associated with JTAG debug.

Typically a 1 to 32-bit bus is provided to communicate trace information and at a typical 100 MHz operating speed these buses provide between 12.5 MB/s and 400 MB/s of bandwidth respectively. The additional circuit pins required for communication of this diagnostic data increase the silicon area of the integrated circuit and thus increase the area of the integrated circuit, the size and number of pins of the package and thus increase the silicon and package cost.

One characteristic of diagnostic signals associated with an integrated circuit are that they may be used for only a small proportion of the life of the device. For example, debug capabilities may in practice only be required for debugging a few prototype devices and production devices will not use the debug capabilities provided on-chip. Thus the trace pins may only be bonded out in prototype designs. Another example is integrated circuit calibration, configuration, or in-circuit programming, which normally takes place upon integrated circuit fabrication and manufacture and does not form part of the ongoing functional use of the integrated circuit by a user. The present technique recognises that provision of dedicated diagnostic interfaces comprising one or more integrated circuit pins is wasteful of resources.

The following documents describe known ways of handling diagnostic data on an integrated circuit. These documents are accessible via the website www.googlescholar.com "System Solutions for a Baseband SoC," by Dominic Pajak, Processors Division, ARM, IQ (Information Quarterly) Magazine, Volume 5, Number 2, 2006;

"Processor and System Bus On Chip Instrumentation" by Rick Leatherman, Bruce Ableidinger et al, by First Silicon Solutions (www.fs2.com);

"Debugging Aids for System-on-a-Chip" by Ross Bannatyne, 0-7g03-5075-8/98/01998 IEEE;

"Design for Debug: Catching Design Errors in Digital Chips" by Bart Vermeulen et al 0740-7475/02/2002 IEEE;

"Embedded Test and Debug of Full Custom and Synthesisable Microprocessor Cores" by Andrew Burdass et al, White paper available from www.arm.com;

"Debug architecture for System on Chip taking full advantage of the Test Access Port" by E Moerman et al Proceedings of the Eighth IEEE European Test Workshop (ETW'03)1530-1877/03 2003 IEEE;

Nexus interface Application Note AN2298/D by Randy Dees available from the website www.freescale.com; and Digital System Debug Techniques by Mark W Klingensmith, 0-7803-4303-4/97/0.0109 97 IEEE.

SUMMARY OF THE INVENTION

Viewed from a first aspect the present invention provides an integrated circuit comprising:

a functional processing circuit for processing a functional signal;

a diagnostic circuit for processing a diagnostic signal;

a signal interface providing a communication path between said integrated circuit and at least one external device; and a signal interface controller having a monitoring circuit for monitoring a signal associated with at least one of said functional circuit and said diagnostic circuit wherein said signal interface controller is responsive to said monitored signal to selectively communicate at least one of said functional signal and said diagnostic signal on said interface.

The present invention recognises that a single signal interface can be used to communicate a functional signal generated by a functional processing circuit of an integrated circuit and a diagnostic signal from a diagnostic circuit of the integrated circuit. A signal interface controller on the integrated circuit controls selective communication of at least one of the diagnostic signal and the functional signal. The control being performed in dependence upon monitoring of a signal associated with at least one of the functional circuit and the diagnostic circuit. The monitoring circuit enables the signal interface to be automatically (i.e. dynamically) switched between use for communication of the diagnostic signal and communication of the functional signal depending upon the current system requirements. Use of a single signal interface for both signals obviates the need for dedicated trace diagnostic pins such as trace/debug pins on the integrated circuit and thus reduces packaging costs and silicon area (which is particularly important for pad-limited designs).

Furthermore an existing functional signal interface can be used for communication of diagnostic data as well as for the functional data. This provides additional diagnostic data bandwidth without increasing the system cost. By reducing the number of fast and power-hungry input/output pins required on an integrated circuit, the present technique reduces the static power consumption of the system in normal operation. Although the dynamic power consumption of the combined diagnostic and functional interface could in some cases be higher than having separate diagnostic interface pins whilst diagnostic processing operations are being performed, this potential increase in dynamic power consumption (in debug mode but not in normal functional mode) is offset by reduced static power consumption.

Selective communication of at least one of the functional signal and the diagnostic signal may well involve simultaneous communication of both signals across the same signal interface (e.g. in parallel), the selection being responsive to the monitored signal. However, in one embodiment the signal interface controller performs time division multiplexing of the functional signal and the diagnostic signal.

The monitoring circuit of the signal interface could be used to directly monitor activity on the signal interface or could use any one or combination of signals associated with the diagnostic circuit and/or the functional processing circuit. However, in one embodiment the monitoring circuit monitors the clock signal such that the functional signal and the diagnostic signal are sampled at respective different phases of the clock signal for at least a subset of the plurality of clock cycles. Monitoring the clock signal is simple to perform yet enables available sampling points to be efficiently identified. Accordingly, if the functional signal is only being communicated on some edges of the clock signal then a communication protocol can be used such that the diagnostic signal can be sampled on different edges of the clock signal for at least a portion of the operational time of the device, which makes better use of available bandwidth on the signal interface.

It will be appreciated that the diagnostic signal and the functional signal could be sampled on any one of the clock edges in a given clock cycle. However, in one embodiment one of the functional signal and the diagnostic signal is sampled on a rising edge of the clock signal and the other of the functional signal and the diagnostic signal is sampled on a falling edge of the clock signal. This allows, for example, a double data rate communication protocol to be used in communication of the diagnostic signal and the functional signal to increase the bandwidth and improve the efficiency on data communication even when an external device receiving the functional signal is only capable of processing single data rate functional data.

It will be appreciated that the signal interface controller could time division multiplex the diagnostic signal and the functional signal by appropriately allocating bandwidth to each of the two signals according to data that it is currently required to communicate in a number of different ways. Thus, for example, data of the diagnostic signal can be communicated across the signal interface even when there is a simultaneous requirement to communicate data of the functional signal. However, in one embodiment the monitoring circuit of the signal interface controller monitors use of the signal interface by one of the functional signal and the diagnostic signal (for example by monitoring a signal associated with the functional circuit or the diagnostic circuit) and identifies available ones of the clock cycles when the signal interface is not being used to communicate data that signal. The signal interface controller then controls the time division multiplexing such that data associated with the other of the functional signal and the diagnostic signal is communicated using the available clock cycles. This improves efficiency by exploiting "idle time" when the interface it is not being used to its full capacity by one of the functional signal or the diagnostic signal. The idle time can be either idle time with respect to the functional signal (i.e. time intervals when the functional signal is not being communicated) or idle time with respect to the diagnostic signal (i.e. time intervals when the diagnostic signal is not being communicated).

It will be appreciated that the monitoring circuit of the signal interface controller could monitor any type of signal associated with the diagnostic circuit or the functional circuit of the integrated circuit device. However, in one embodiment the signal monitored by the monitoring circuit is a control signal. Since control signals are typically used for other purposes during normal functional operation of the integrated circuit they are easy to intercept for monitoring. Such control signals can conveniently provide information with regard to current signal activity (e.g. memory transactions and trace stream output) on the signal interface.

In one embodiment the signal interface controller comprises an arbitration circuit for selectively enabling communication of data from the functional signal and the diagnostic signal on the signal interface. The arbitration circuit provides an efficient way of controlling the time division multiplexing.

Although time division multiplexing of the functional signal and the diagnostic signal could be performed such that data associated with one of the signals is only communicated during periods when the signal interface is idle with respect to communication of the other signal. However in one embodiment the functional signal and the diagnostic signal have associated priority levels and the signal interface controller is operable to perform time division multiplexing in dependence upon the priority levels. This priority-based scheme provides flexibility with regard to managing communication resources and enables either the diagnostic signal or the functional signal to be prioritised according to current processing conditions on the integrated circuit. For example, the functional signal could routinely be given higher priority than the diagnostic signal. Alternatively, the diagnostic signal could be given higher priority than a functional signal associated with a low bandwidth direct memory access (DMA) master, because the DMA master is unlikely to be adversely affected by the extra latency.

It will be appreciated that the signal interface could take many different forms such as a Peripheral Component Interconnect (PCI) Express interface, but in one embodiment the signal interface is a memory interface and the at least one external device comprises a memory device. Memory interfaces typically support high data bandwidths and provide both a fast and a wide bus interface. However, a large portion of the external memory interface bandwidth can be unutilised due to the characteristics of the external memory devices. Use of a memory interface to transmit to both a functional signal and a diagnostic signal makes more efficient use of the available bandwidth on the memory interface by reducing the idle time when the memory interface is not being used to communicate data associated with memory transactions.

Although any type of control signal could be used by the monitoring circuit for control of time division multiplexing of the functional signal and the diagnostic signal, in one embodiment the control signal used by the monitoring circuit is a chip select signal associated with the external memory device. The chip select signal is a pre-existing signal already used for performing many memory transactions and conveniently provides information with regard to current usage of (i.e. activity on) the memory interface and thus facilitates identification of "idle periods".

Although the memory interface could have a number of different forms, according to the present technique the memory interface is an Integrated Drive Electronics (IDE) interface or an interface to an SRAM, a SDRAM, a DDR-SDRAM or a flash memory.

It will be appreciated that in the case where the signal interface is a memory interface, the functional signal that is time division multiplexed with the diagnostic signal could be any functional signal associated with the memory device. However, in one embodiment the functional signal comprises at least one of a data signal, an address signal and a control signal for the memory device.

It will be appreciated that the functional signal could take many different shapes and forms and could comprise various types of functional data. However in one embodiment the functional signal is a video signal and in another embodiment the functional signal is an audio signal.

Although the diagnostic signal could be time division multiplexed with the video signal in a variety of different ways, in one embodiment the signal interface controller communicates data of the diagnostic signal on the signal interface when the video signal is not being communicated on the interface (e.g. during a horizontal or vertical blanking interval of the video signal).

Although the diagnostic signal could be time division multiplexed with the audio signal in a variety of different ways, in one embodiment the signal interface controllers controls the multiplexing such that the diagnostic signal is output in a subset of time slots associated with a predetermined audio signal format. This provides for efficient use of unused time slots that would otherwise be redundant for communication of diagnostic data or for redeployment of superfluous timeslots.

In one embodiment the diagnostic signal is multiplexed with a functional signal comprising an audio signal or a video signal such that low-order bits of the functional signal are replaced by data of the diagnostic signal. This enables more efficient use of the signal interface without causing significant deterioration in the quality of the output video signal or output audio signal.

It will be appreciated that the diagnostic signal could be any one of a number of different signal types, but in one embodiment the diagnostic signal is one of a trace signal, an incoming debug signal and an outgoing debug signal.

The integrated circuit can assume that external devices receiving the time division multiplexed diagnostic signal and functional signal will be unaffected by the multiplexed data that is irrelevant to the functioning of that device. For example, a single data rate (SDR) external memory configured to communicate data only on the rising edges of the clock signal will ignore any data communicated on the falling edges of the clock signal (subject to setup and hold timing requirements being met). In one embodiment the integrated circuit comprises a signal identification circuit operable to output to at least one external device an identification signal indicating which of the functional signal and the diagnostic signal is being communicated across the signal interface. This simplifies demultiplexing of the time division multiplexed signal when received at the external devices.

It will be appreciated that the identification signal could be multiplexed together with other signals for communication to the external devices, but in one embodiment the integrated circuit has a dedicated pin for communication of the identification signal.

Although the signal interface could comprise a single pin, in one embodiment the signal interface comprises a plurality of pins and the signal interface controller controls the signal interface such that communication of the functional signal is performed using a first subset of the pins and communication of the diagnostic signal is performed using a second subset of the plurality of pins This provides an efficient way in which to accommodate communication of both signals across a single interface. It also provides for changes in required bandwidths for diagnostic data relative to functional data in response to the monitored signal by an appropriate choice of the first and second subsets.

In one embodiment the first subset and the second subset are non-overlapping subsets. This simplifies the process of separation of the diagnostic signal and the functional signal at a receiving device.

Viewed from a second aspect the present invention provides a data processing apparatus comprising:
an interface for receiving a signal comprising at least one of a functional signal and a diagnostic signal;
a signal identification circuit for identifying when said diagnostic signal is being selectively communicated across said signal interface; and
a signal separating circuit for separating said received signal to obtain said diagnostic signal.

Viewed from a third aspect the present invention provides an integrated circuit comprising:
a functional processing circuit for processing a functional signal comprising at least one multi-bit value;
a diagnostic circuit for processing a diagnostic signal;
a signal interface providing a communication path between said integrated circuit and at least one external device;
a signal interface controller for controlling communication of said diagnostic signal and said functional signal across said signal interface such that at least one bit of said multi-bit value is replaced by data of said diagnostic signal.

Viewed from a fourth aspect the present invention provides a data processing apparatus comprising:
an interface for receiving a signal having at least one multi-bit value comprising data from both a functional signal and a diagnostic signal;
a signal identification circuit for identifying which bits of said multi-bit value correspond to said diagnostic signal; and
a signal separating circuit for separating said received signal to obtain said diagnostic signal.

Various respective aspects and features of the invention are defined in the appended claims. Combinations of features from the dependent claims may be combined with features of the independent claims as appropriate and not merely as explicitly set out in the claims.

The above, and other objects, features and advantages of this invention will be apparent from the following detailed description of illustrative embodiments which is to be read in connection with the accompanying drawings.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
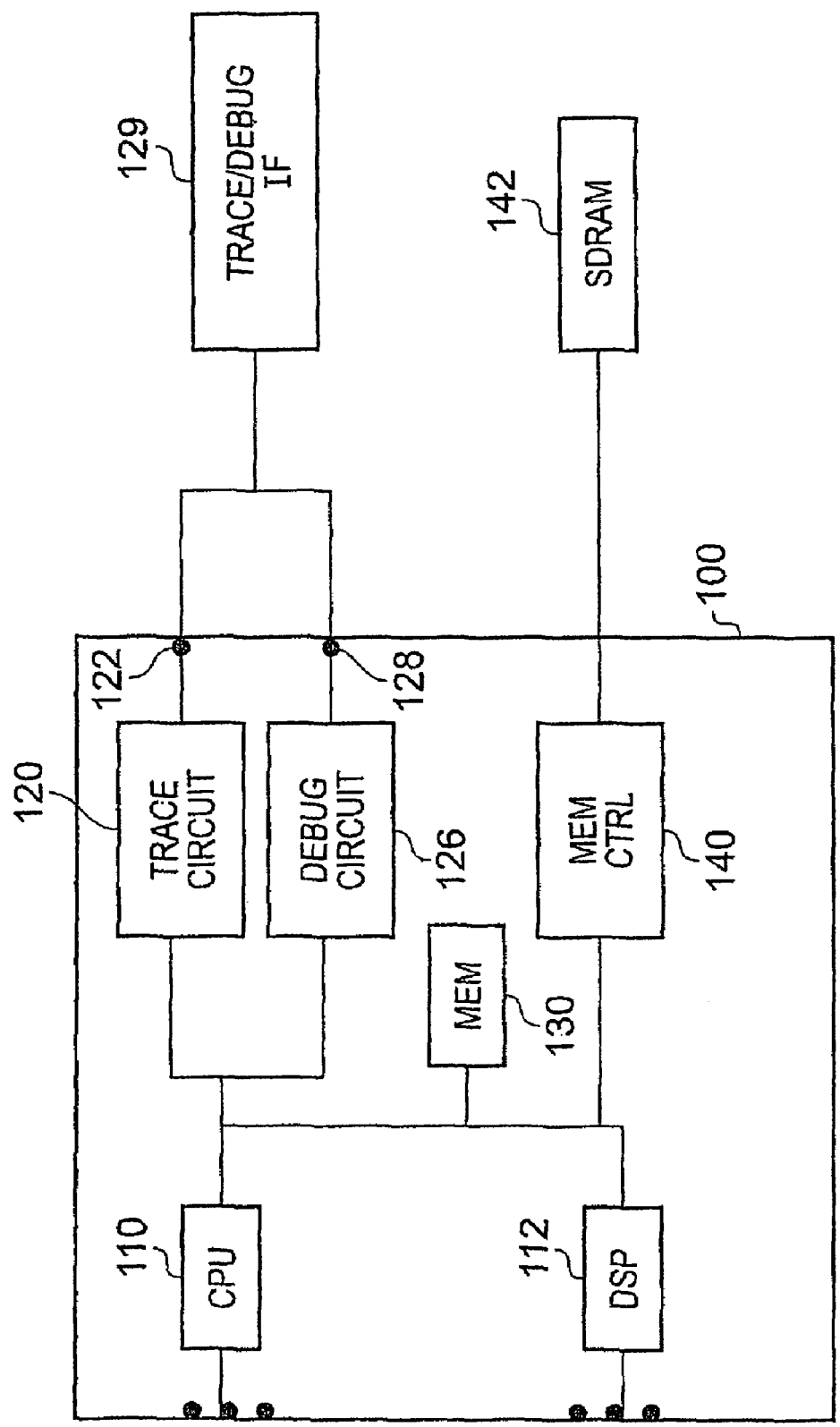
FIG. 1 schematically illustrates a known integrated circuit in which a diagnostic signal and a functional signal have separate interfaces for connection to external devices.

FIG. 1 schematically illustrates a known integrated circuit in which a diagnostic signal and a functional signal have separate interfaces (integrated circuit pins) for connection to external devices. The integrated circuit 100 comprises a central processing unit (CPU) 110 and a digital signal processor (DSP) 112, which are both functional circuits. The integrated circuit 100 also comprises a trace circuit 120 with a corresponding trace interface 122 and a debug circuit 126 with a corresponding debug interface 128.

The trace interface 122 outputs trace data and the debug interface 128 outputs debug data to and receives debug data from a trace/debug interface 129. A general purpose computer (not shown) is used to analyse trace and debug data output by the integrated circuit 100.

The integrated circuit is provided with an on-chip memory 130 that serves to store data at the request of the CPU 110. This on-chip memory 130 is used to temporarily buffer trace data from the trace circuit 120. The integrated circuit 100 also has a memory controller 140, which controls access to an external memory 142. The external memory 142 in this arrangement is SDRAM (which is volatile memory), but in alternative arrangements the external memory could be static memory. Examples of integrated circuits include Field Programmable Gate Arrays (FPGAs) and Application Specific Integrated Circuits (ASICs).

In this known arrangement separate interfaces (in this case integrated circuit pins) are provided for (i) the trace data (ii) the debug data; and (iii) the functional data (associated with data transfer between the integrated circuit 100 and the external SDRAM 142. Thus in this arrangement at least three interfaces, each comprising one or more pins are required to communicate data to and from the integrated circuit 100 during normal functional operation.

Figure 2:
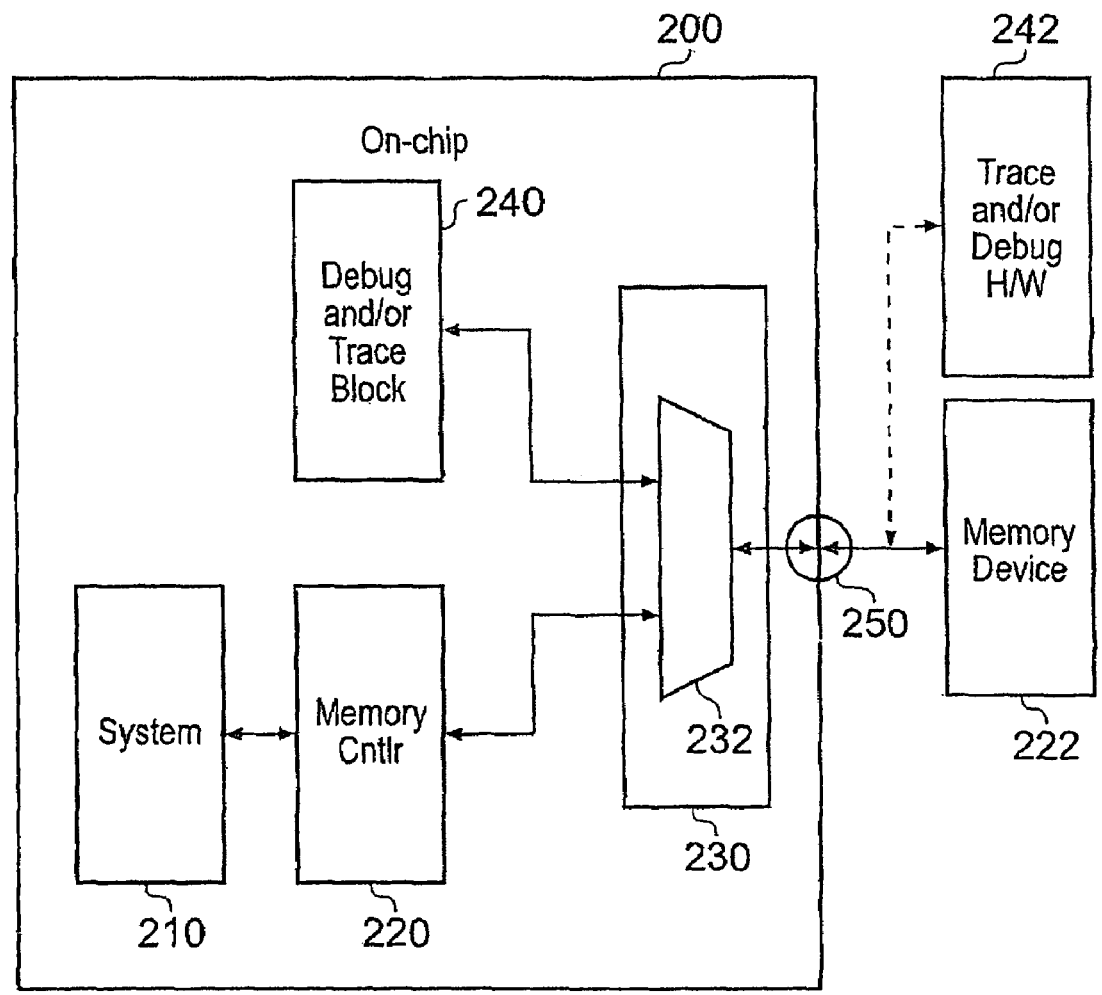
FIG. 2 schematically illustrates an integrated circuit in which a functional signal and a diagnostic signal are selectively communicated across a common signal interface.

FIG. 2 schematically illustrates an integrated circuit according to the present technique, in which a functional signal and a diagnostic signal are selectively communicated (in this particular example by time division multiplexing) across a common signal interface. The integrated circuit 200 comprises: a processing circuit 210; a memory controller 220; an external memory device 222; a signal interface controller 230 comprising a multiplexer 232; an on-chip debug/trace block 240; external trace/debug hardware 242 and a common signal interface 250.

In this arrangement the memory controller 220 passes data between the integrated circuit system 210 and the external memory device 222 via a signal interface controller 230 that has a multiplexer 232. The multiplexer receives data from both the on-chip debug/trace block 240 and the memory controller 220. The signal interface controller 230 includes arbitration logic to control access to the common signal interface 250 for communication of a functional signal generated by the system 210 and a diagnostic signal associated with the debug/trace block 240.

Trace data is output from the integrated circuit 200 to the external trace/debug hardware 242. Debug data passes bi-directionally between the on-chip debug/trace block 240 and the external trace/debug hardware 242. This trace data and debug data form a diagnostic signal, which is communicated via the common signal interface 250 under the control of the signal interface controller 230 which time division multiplexes the functional signal and the diagnostic signal.

In this particular arrangement the signal interface controller monitors usage of the common signal interface 250 by monitoring control signals from the memory controller 220 (which is a functional device of the integrated circuit 200). Time division multiplexing of the diagnostic signal and the functional signal is performed in dependence upon these monitored memory control signals.

The signal interface controller 230 decodes memory control signals received from the memory controller 220 to determine when the common interface 250 is required for memory transactions and re-encodes the memory control signals before transmitting them to the external memory device 222. In this particular arrangement the external memory device 222 is SDRAM, but in alternative arrangements the external memory device is an SRAM, a DDR-SDRAM or a Flash memory. Other types of volatile or non-volatile external memory devices can also be used. In further alternative arrangements the interface between the memory controller 220 and the external memory device 222 is an integrated drive electronics (IDE) interface such as an advanced technology attachment ATA.

The signal interface controller 230 effectively tracks a state machine associated with the memory controller 220. The signal interface controller 230 controls the signal interface such for at least some of the time intervals when the common signal interface 250 is not being used for communication of functional data between the memory controller 220 and the memory device 222, it is used to communicate diagnostic data between the on-chip debug/trace block 240 and the external trace/debug hardware 242.

Communication between the on-chip memory controller 220 and the external memory device 222 involves a memory control bus, a memory address bus and a memory data bus. In the case where the external memory device 222 is a non-volatile memory (such as NOR) the interface will typically operate at 66 MHz and provide a 32-bit bus which gives 264 MB/s. However in arrangements where the external memory device 222 is a volatile memory device (e.g. DDR-SDRAM) the interface 250 will typically provide 1.3 GB/s (166 MHz*32-bit bus). Characteristics of the external memory device 222 mean that a large portion of the external memory interface bandwidth is not utilised for communication of functional data. However, this available bandwidth is used for communication of diagnostic data.

Due to large access latencies associated with the external memory device 222 the communication channel between the external memory device 222 and the memory controller will only be utilised to communicate data associated with memory access operations for a proportion of the time when the integrated circuit is operating. For example, typically less than 70% of the data interface bandwidth is utilised for the functional data in SDRAM interfaces. In addition to channels for communication of data between the memory controller 220 and the memory device 222 there are also channels for communication of memory control signals and memory addresses. In arrangements in which the memory device 222 is static memory, a bandwidth of 224 MB/s (66 MHz*28-bit) is provided for communication of address data. In alternative arrangements where the external memory device 222 is volatile memory, the address interface provides 311 MB/s (166 MHz*15-bit).

Since high-performance external memory devices such as memory device 222 typically perform burst transactions, a single memory address provides a burst of data which means that the address bus if it were a dedicated bus would frequently be idle. However, in the arrangement of FIG. 2 the signal interface controller 230 monitors a memory control signal, which provides an indication of use of the common signal interface 250. Thus the signal interface controller identifies time intervals (e.g. sampling points or timeslots) which are not being used for communication of memory data, memory address data and/or memory control signals and uses these available timeslots to transmit diagnostic data between the debug/trace block 240 and the external trace/debug hardware 242.

In the arrangement of FIG. 2 memory control signals are used to monitor the use of the common signal interface 250 for communication of a functional signal and the diagnostic signal is time-division multiplexed with the functional signal in dependence upon results of the monitoring. However, in alternative arrangements, one or more signals associated with the on-chip debug/trace block 240 are used to monitor the use of the common signal interface 250 for communication of a diagnostic signal and the functional signal is communicated in dependence upon results of the monitoring. The signal interface controller 230 is responsive to the monitored signal to selectively communicate at least one of the functional signal and the diagnostic signal. Use of the monitored signal in this way enables dynamical modification of the way in which the functional signal and diagnostic signal are communicated (i.e. multiplexed).

Examples of data passed between the debug/trace block 240 and the external trace/debug hardware 242 of FIG. 2 include data associated with debug, integrated circuit trace, integrated circuit calibration, integrated circuit configuration, integrated circuit production test and in-circuit programming of integrated circuits. Further diagnostic operations may also be possible. A general purpose computer (not shown) is used to perform further processing upon the diagnostic signals received and isolated by the trace/debug external hardware 242, so as to support one or more of debug, trace, calibration, configuration, production test and programming. The signal interface controller 230 effectively performs time division multiplexing of the functional signal with the diagnostic signal across the common signal interface 250 to efficiently utilise the available bandwidth on the signal interface.

Figure 3:
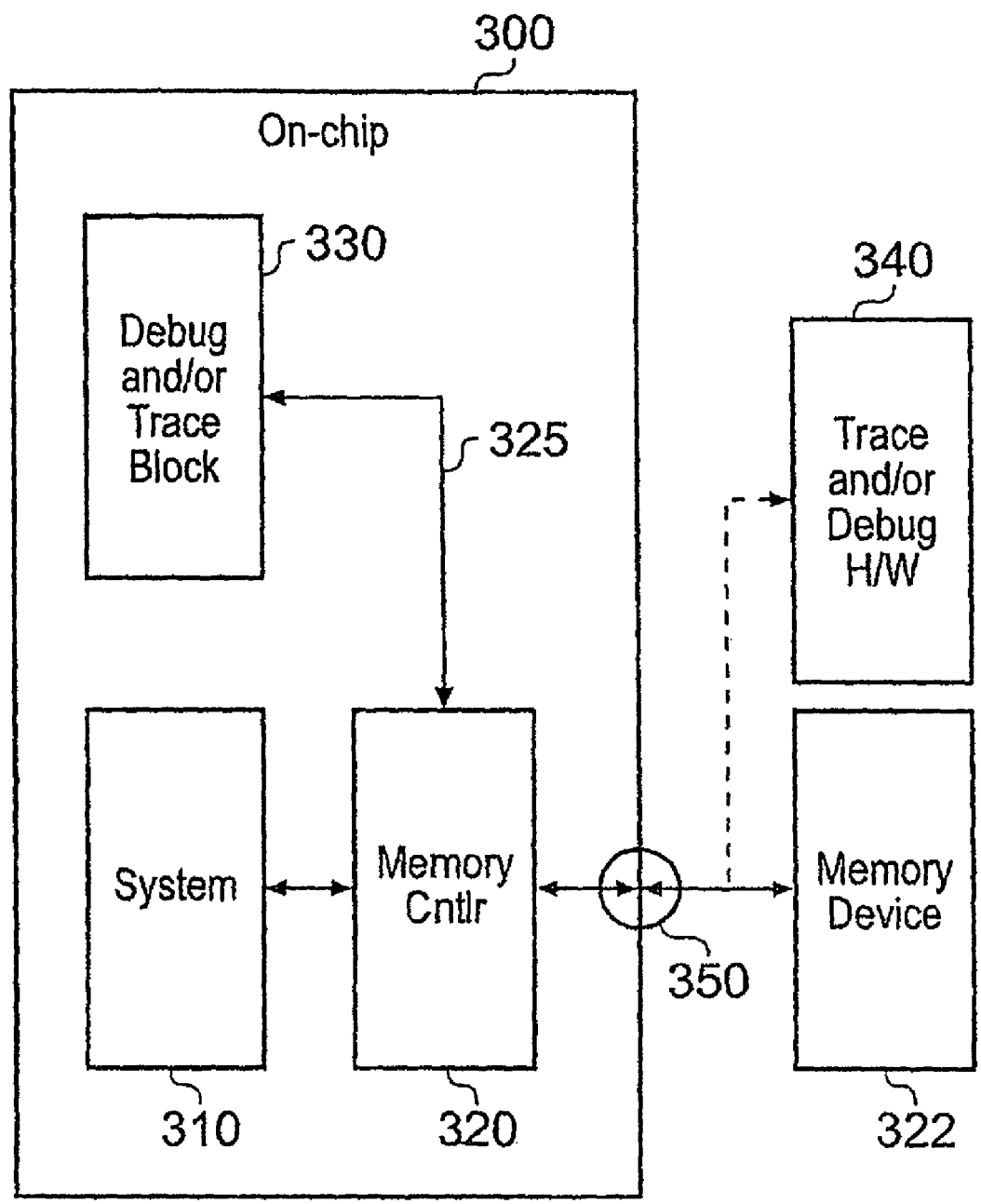
FIG. 3 schematically illustrates an integrated circuit for selective communication of a functional signal and a diagnostic signal across a common interface and in which a memory controller on the integrated circuit controls the selective communication FIG. 4 schematically illustrates an integrated circuit for multiplexing a diagnostic signal and a functional signal across a common signal interface and in which an on-chip communication channel is provided between a memory controller and an on-chip debug/trace block.

FIG. 3 schematically illustrates an integrated circuit in which both a functional signal and a diagnostic signal are selectively communicated on a common signal interface and where a memory controller on the integrated circuit controls the time division multiplexing. Again, in this case the selective communication is performed using time-division multiplexing. The arrangement of FIG. 3 comprises an integrated circuit 300; a processing circuit 310; a memory controller 320 for controlling memory accesses on an external memory device 322; an on-chip debug/trace block 330 and an external trace/debug hardware unit 340.

FIG. 3 illustrates an alternative arrangement to the arrangement of FIG. 2 and differs from the arrangement of FIG. 2 in that, instead of providing a separate signal interface controller 230, the functions of monitoring activity on the common signal interface 350 (via a signal associated with the memory controller 320) and controlling time division multiplexing of the functional signal and the diagnostic signal in dependence upon that monitoring is provided by circuitry forming part of the memory controller 320.

Accordingly, an internal communication path 325 is provided within the integrated circuit 300 between the on-chip debug/trace block 330 and the memory controller 320. Thus both the diagnostic signal and the functional signal are routed through the common signal interface 350 via the memory controller 320. This arrangement obviates the need to decode the memory control signals in order to perform the monitoring upon which time-division multiplexing depends. Decoding and re-encoding of memory control signals is not required in this arrangement because the memory controller 320 itself controls communication of both the functional signal and the diagnostic signal across the signal interface 350. The memory controller 320 controls time-division multiplexing such that it allows the diagnostic signal to pass between the on-chip debug/trace block 330 and the external trace/debug hardware 340 via the common signal interface 350 when it determines that there is sufficient bandwidth that the functional operation of the integrated circuit will not be compromised by input/output of the diagnostic data. In the arrangement of FIG. 3, one or more parity bits used for checking the integrity of functional data can be used for communication of functional data. This is particularly useful in low noise environments such as a laboratory testing environment.

Figure 4:
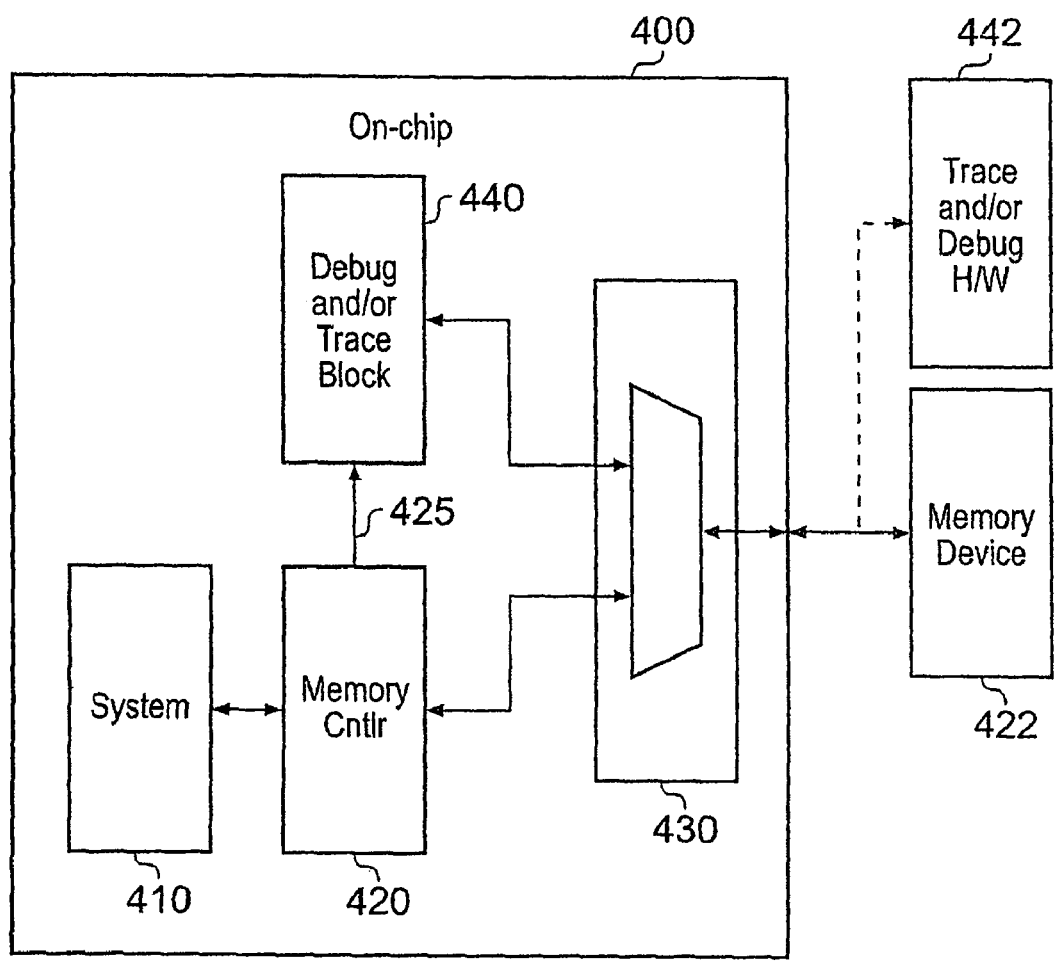

FIG. 4 schematically illustrates an integrated circuit in which both a diagnostic signal and a functional signal are selectively communicated across a common signal interface and in which an on-chip communication channel is provided between a memory controller and an on-chip debug/trace block. The integrated circuit comprises a processing circuit 410; a memory controller 420 for communicating with an external memory device 422; a signal interface controller 430; an on-chip debug/trace block 440; an external trace/debug hardware unit 442; and an on-chip communication line 425 between the on-chip debug/trace block 440 and the memory controller 420.

The arrangement of FIG. 4 is similar to the arrangement of FIG. 2, but differs in that the memory controller 420 communicates directly with the on-chip debug/trace block 440 via a communication channel 425. In this case the on-chip debug/trace block decodes the one or more memory transaction control signals which it receives via the on-chip communication channel 425 between itself and the memory controller 420, which means that the signal interface controller 430 is not in this case responsible for decoding and re-encoding memory controller transactions.

The arrangements of FIGS. 2-4 make use of a common signal interface to communicate a functional signal between a memory controller and a memory device and to communicate diagnostic data between an on-chip debug/trace block and external trace/debug hardware. In these particular arrangements the form of selective communication used is time-division multiplexing of the functional signal and the diagnostic signal.

However, in alternative arrangements, the selective communication is performed by appropriately selecting a first subset of parallel communication channels of the signal interface for communication of functional data and a second subset of parallel communication channels of the signal interface for communication of diagnostic data. The number of channels allocated to each signal (functional/diagnostic) is dynamically varied in dependence upon the monitored signal (e.g. chip select signal).

In one such arrangement that uses a signal interface having a plurality of parallel communication channels, a narrower bus width is deliberately selected for communication of the functional signal to facilitate communication of diagnostic data. The bits of the bus that it has been elected not to use for the functional data are then used for communication of diagnostic data. For example, in an arrangement where the external memory of FIG. 3 is a 4-bit SD Card, the memory controller 320 controls the memory 322 such it operates in a 1 bit mode and the remaining 3 bits are used for communication of diagnostic data. In this case, the first subset of communication channels and the second subset of communication channels (as referred to above) are non-overlapping.

Figure 5:
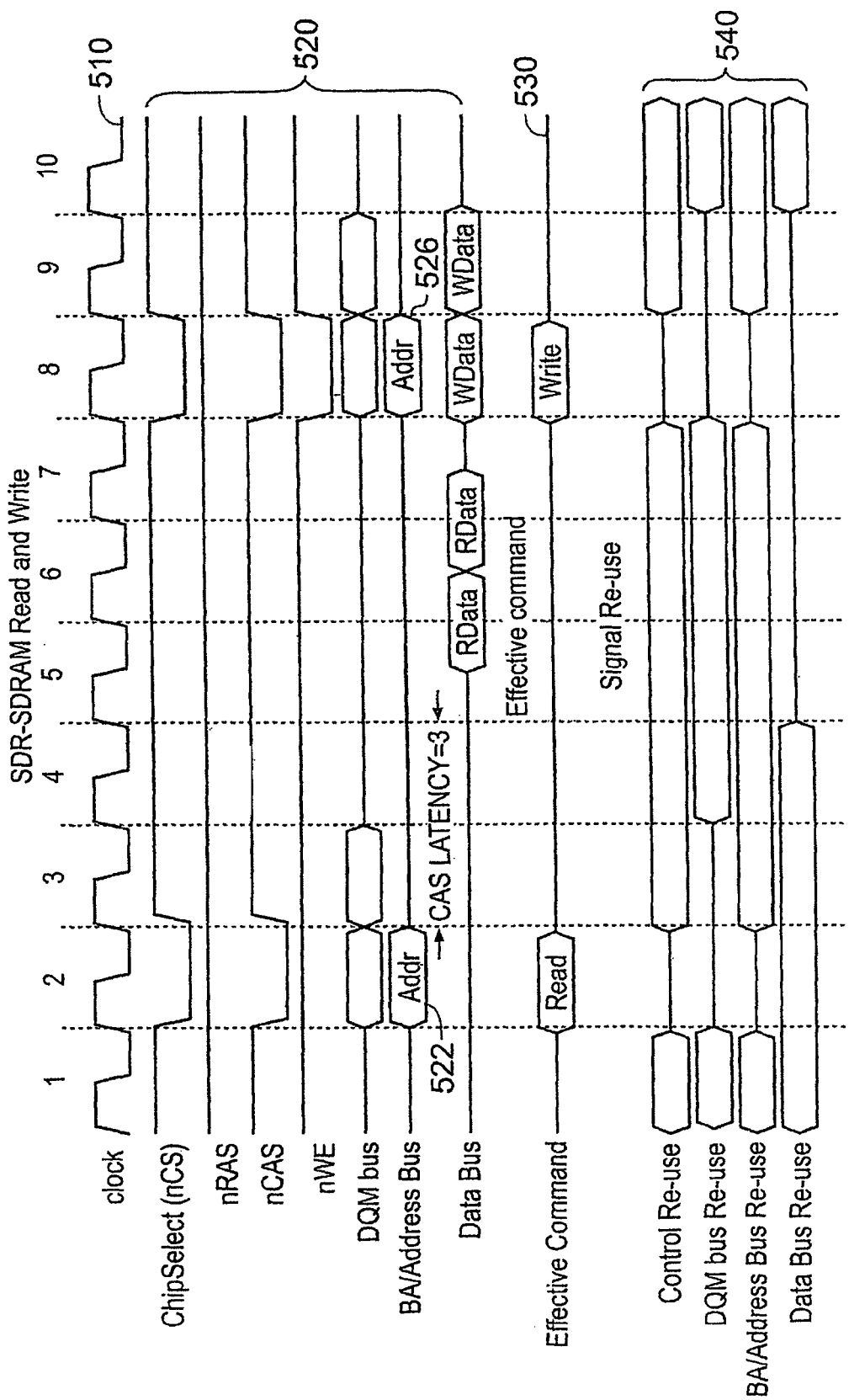
FIGS. 5-8 are signal diagrams schematically illustrating how signals associated with the memory controller and an external memory device can be used to identify appropriate times to communicate diagnostic data across the common signal interface.

FIG. 5 is a signal timing diagram showing memory read/write transactions for the embodiment of FIG. 3 in the case where the external memory device is single data rate (SDR) SDRAM.

Note that, the signal timing diagrams of FIGS. 5-8 and 12 show signals associated with a memory controller (functional circuit) and external memory and at least a subset of those signals is used by the monitoring circuit of the signal interface controller of the integrated circuit (e.g. arbitration block 230 in FIG. 2 or memory controller 320 itself in FIG. 3) to control selective communication of a functional signal and a diagnostic signal. The arrangement of FIG. 3 uses the memory controller 320 to control the signal interface in dependence upon one or more memory control signals. However, the embodiment of FIG. 2 employs the signal interface controller 230 to interpret memory commands and to deduce when the control, address and data buses are available.

Referring to FIG. 5, signal 510 is a clock signal according to which data communication across the signal interface 350 is sampled. Ten complete clock cycles are shown in FIG. 5. The signal group 520 comprises control signals associated with memory transactions between the memory controller 320 and the external memory device 322. These control signals comprise: chip select (nCS), nRAS, nCAS, nWE, DQM bus, BA/address bus and data bus. The chip select signal (nCS) even when considered in isolation of the other control signals provides an indication of when the control bus and the address bus are used for the memory device 322, but does not provide the same in-use information with regard to the data bus.

The DQM bus (data mask bus) signal provides an indication of which lanes on the memory data bus are currently active. It can be seen by comparison of the address bus signal and the data bus signal that there is a latency between issuance of the address signal 522 in the second clock period and the initiation of the associated memory read transaction (RData) which occurs during the fifth clock cycle. By way of contrast, it can be seen that for memory write transactions the address signal 526 on the BA/address bus associated with the memory write transaction is coincident with the write data transaction (WDATA) on the data bus because data for writing starts at the same time as the memory address signal.

Signal 530 in FIG. 5 is not a physical (i.e. real) signal but is in fact an "effective command" representing the assimilation of data from the control signal group 520. It can be seen that the net effect of the control signals 520 is that a memory read transaction is performed on the communication interface 350 in clock cycle 2 and a memory write operation is performed on the signal interface 350 in clock cycle 8. Signal group 540 in FIG. 5 provides an indication of when the signal interface 350 of FIG. 3 can be used for communication of the diagnostic signal. From one point of view, this can be considered to be re-use of a memory signal interface for communication of diagnostic data.

The "signal reuse" patterns 540 provide indications of which clock cycles involve activity corresponding to memory transactions for each of: the memory control bus; the data mask bus (DQM); the BA/address bus; and the data bus. In particular, it can be seen that the signal interface 350 can be used in this case for communication of diagnostic data as follows: the control bus can be reused in clock cycles 1, 3-7, 9-10; the DQM bus can be reused in clock cycles 1, 4-7 and 10; the BA/address bus can be used in clock cycles 1, 3-7 and 9-10; and the data bus can be re-used in clock signals 1-4 and 10. A monitoring circuit within the memory controller 320 of FIG. 3 monitors the memory control signals to determine the signal re-use pattern 540. The memory controller 320 comprises signal interface controlling circuitry operable to control time division multiplexing of the diagnostic signal and the functional signal such that data of the diagnostic signal is communicated during clock cycles that are effectively idle with respect to communication of data associated with memory transactions. It will be appreciated that not all of the control signals 520 need be used by the signal interface controller to control the multiplexing, but one or more of those signals can be used. For example, as noted above, the chip select signal (nCS) alone can be used to reliably indicate clock cycles when both the control bus and the address bus in use/not in use for communication of functional data associated with memory transactions.

Figure 6:
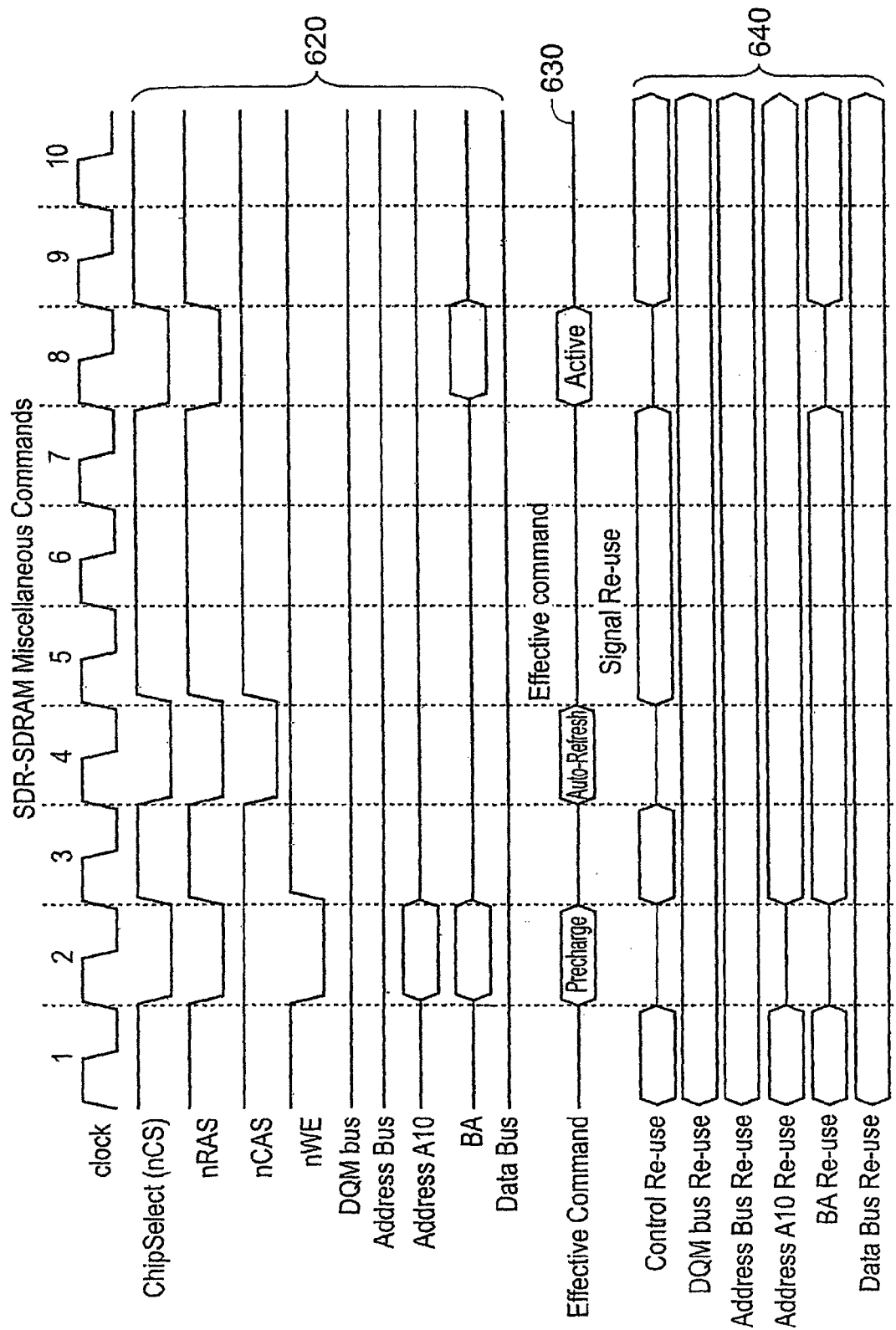

FIG. 6 is a signal diagram that schematically illustrates how time division multiplexing is performed in the arrangement of FIG. 3 in the case where the external memory device is an SDR-SDRAM for the case of miscellaneous commands (i.e. commands other than read and write transactions). As for FIG. 5, ten complete clock cycles are shown. A signal group 620 represents a group of signals associated with the memory controller 320 and external memory 322 (comprising memory control address and data signals) that together can be used to work out an effective command 630 being communicated across the signal interface 350. The signals in group 620 are similar to the control signals that were monitored by the signal interface controller for the read/write SDR SDRAM memory transactions of FIG. 5, but an additional address A10 signal is shown and a "BA" control signal is shown separately from the address bus signal (combined BA/address bus signal is shown in FIG. 5).

It can be seen from FIG. 6 that the effective command represented by the group of control signals 620 corresponds to a "pre-charge" command being communicated to the external memory device in clock cycle 2, an "auto-refresh" command being communication in clock cycle 4 and an "active" command being communicated in clock cycle 8. The re-use pattern for each of six bus channels is shown by the signal group 640. In this case, the control bus can be re-used for communication of diagnostic data in clock cycles 1, 3, 5-7, 9-10. The data mask bus, the address bus and the data bus can each be reused throughout the full duration of clock cycles 1-10 since these buses are not required for communication of the pre-charge, auto-refresh and active signal commands. The "address A10" bus signal can be re-used for communication of diagnostic data for clock cycles 1 and 3-10 whereas the BA bus channel can be re-used for clock cycles 1, 3-7 and 9-10. In the example of FIG. 6, the chip select signal taken in isolation provides an indication of when the control bus channel can be used for transmission of diagnostic data but not the address bus or the data bus.

Figure 7:
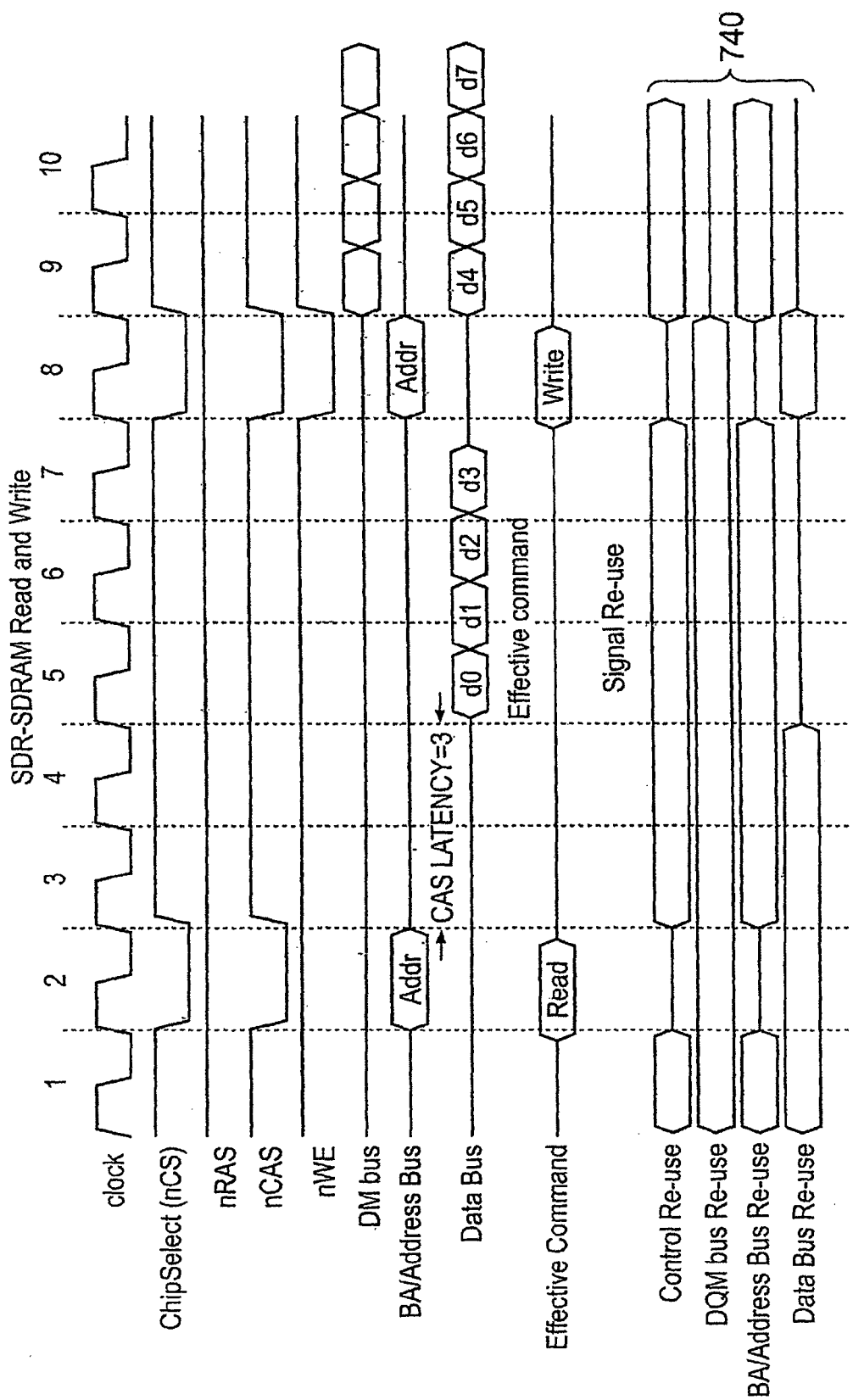

FIG. 7 is a signal diagram schematically illustrating how the time division multiplexing is controlled in the arrangement of FIG. 3 in the case where the external memory device is a double data rate (DDR)-SDRAM memory. The DDR-SDRAM memory transmits two data samples per clock cycle on the data bus.

It can be seen from FIG. 7 that an address for a memory read transaction appears on the control and address bus during clock cycle 2 and four data samples d0, d1, d2 and d3 are output on the data bus (i.e. they are supplied from the memory device 322 back to the memory controller 320 of FIG. 3) in clock cycles 5 to 7. An address corresponding to a write event is output on the control and address bus during clock cycle 8 and the associated write data appears on the data bus during clock cycles 9 and 10. The signal re-use pattern for these read/write transactions is illustrated by the signal group 740 in FIG. 7. It can be seen that re-use of the control bus and the address bus can be determined from the chip select control signal alone. From the chip select signal it is clear that all clock cycles except cycle 2 and cycle 8 can be used for transmission of diagnostic data. The DQM bus can be reused in cycles 1 through 8. The data bus can be reused in clock cycles 1-4 and 8 when no data is present on the data bus.

Figure 8:
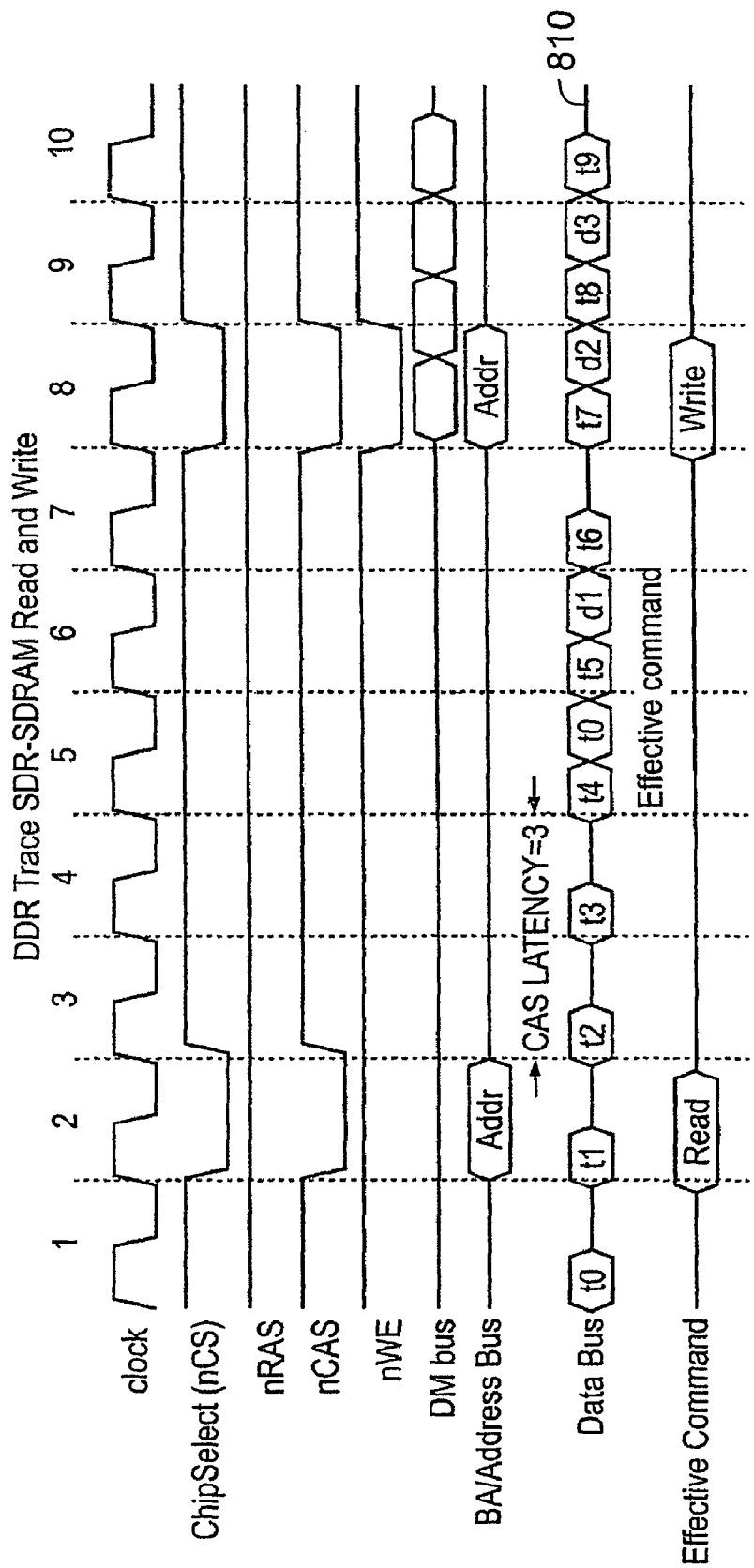

FIG. 8 is a signal diagram that schematically illustrates multiplexing of a functional signal and a diagnostic signal in a case when a double data rate (DDR) protocol is used for transmission of data across a common signal interface 350 but the external memory device is a single data rate SDR-SDRAM memory.

Since the external memory device in the example of FIG. 8 is a single data rate device it expects to receive or transmit data from/to the memory controller on only one edge of the clock signal (in this case the rising edges). Data associated with memory transactions is represented on the data bus signal 810 of FIG. 8 as data elements d0 to d3 whereas diagnostic data (in this case trace data) is indicated by data elements t0-t9. An address associated with a read command appears on the address bus in the second clock cycle and the corresponding read data appears on the data bus on the rising edges of clock cycles 5 and 6.

An address corresponding to a write transaction address appears on the address bus during clock cycle 8 and the associated write data is output on the falling edges of clock cycles 8 and 9. Since the external memory device 322 is configured to output and receive data only on the rising edges of the clock signal, its processing of the functional signal is unaffected by the presence of trace data elements t0-t9 on the falling edges of clock signals 1-10 respectively. In this arrangement, the trace data is time division multiplexed on the data bus of the external memory device 322, which employs a double data rate (DDR) communication protocol. In alternative arrangements, the double data rate protocol could be used on the address bus and the control bus in addition to the data bus. In such alternative arrangements data associated with memory transactions is sampled twice per clock cycle but the address bus and control bus communicate data only on rising edges (SDR transmission). Diagnostic data is interleaved with the memory control and memory address data by making use of the DDR protocol and communicating it on falling edges of the clock cycles (which are known to be unused by the external memory).

Figure 9:
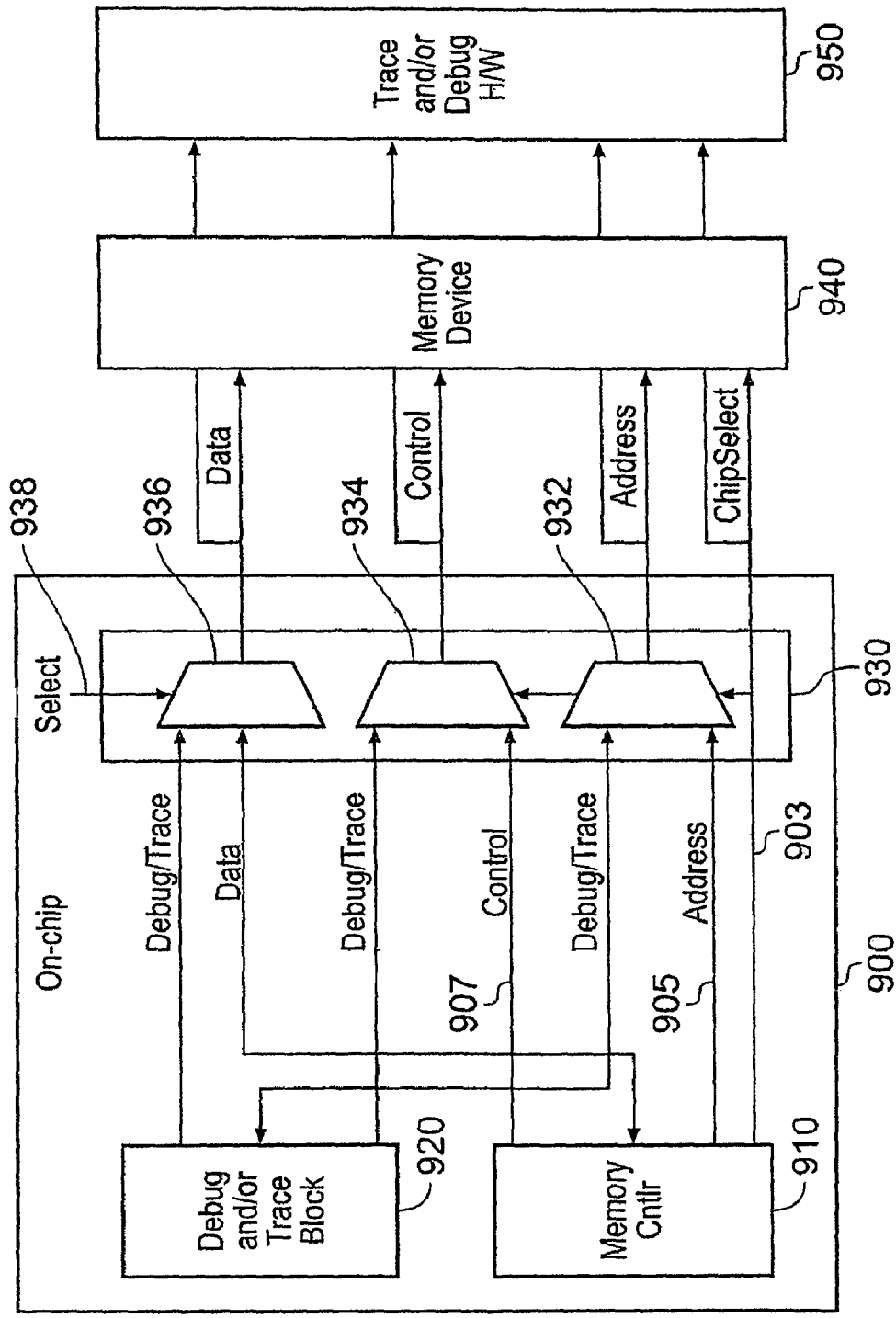
FIGS. 9-11 schematically illustrate an integrated circuit for selectively communicating a diagnostic signal and a functional signal in which the signal interface controller is shown in more detail and in which separate signal paths between the integrated circuit and external devices are also shown.

FIG. 9 schematically illustrates an integrated circuit for time division multiplexing a diagnostic signal and a functional signal in which the signal interface controller in shown more detail. The arrangement of FIG. 9 comprises an integrated circuit 900 having a memory controller 910 and an on-chip debug/trace block 920. The integrated circuit 900 further comprises a signal interface controller 930 having a first multiplexer 932, a second multiplexer 934 and a third multiplexer 936. The multiplexers 932 and 934 are controlled by a chip select signal 903 output by the memory controller 910. The data multiplexer 936 is selected depending upon information with regard to current and previous transactions. The signal interface controller communicates with the external memory device 940 and the external trace/debug hardware unit 950.

The memory controller 910 supplies memory address data to the multiplexer 932, memory control data to multiplexer 934 and communicates memory data with multiplexer 936. The on-chip debug/trace block 920 has a connection to each of the three multiplexers 932, 934, 936 for input/output of diagnostic data. The diagnostic data is communicated across a common signal interface between the integrated circuit 900 and the external trace/debug hardware 950. The memory controller outputs memory data, memory control signals and memory address signals to the multiplexers 932, 934, 936 respectively, but also outputs a chip select signal directly to the external memory device 940 via the communication channel 903. This separate chip select signal 903 is used to control the multiplexers 932 934, which are associated with the address and control signals and hence to control time division multiplexing of the functional data and the diagnostic data. The multiplexer 936, which controls output of data, is controlled by a different select signal 938. Each of the three multiplexers 932, 934, 936 has direct communication paths to each of the external memory device 940 and the external trace/debug hardware 950.

The first multiplexer 932 outputs an address signal, the second multiplexer 934 outputs a control signal and the third multiplexer 936 outputs data to the external memory device 940 and the external trace/debug hardware 950. The multiplexer arrangement illustrated in FIG. 9 operates efficiently without loss of any data provided that there is sufficient bandwidth in the common signal interface to communicate all data associated with memory and all of the diagnostic data.

The signal interface controller 930 is operable to perform arbitration such that the diagnostic data from the debug/trace block 920 has an associated priority level and the functional data being communicated between the external memory device 940 and the on-chip memory controller 910 has a respective associated priority. The time division multiplexing is controlled in dependence upon the associated priority such that that higher priority data is transmitted preferentially to lower priority data and the signal interface controller 930 monitors at least one signal associated with the on-chip debug/trace block 920 and/or the memory controller 910 to determine when the common signal interface is required for communication of the functional signal and/or the diagnostic signal. Typically the functional data will have a higher priority than the diagnostic data so that the functional data will be preferentially transmitted. However, in some circumstances it may be desired to preferentially communicate the diagnostic data by giving it a higher priority than at least some of the functional data. In this case communication of the diagnostic information will to some extent interfere with (i.e. disrupt or delay) communication of the functional data but since the level of interference can be controlled via the assigned priorities for each of the functional signal and the diagnostic signal, the level of disruption or interference can be effectively controlled. Note that the embodiments of any one of FIGS. 2 to 4 have signal interface controllers capable of performing time division multiplexing in dependence upon priority information.

An example application of arrangements such as the arrangement of FIG. 9, in which the signal interface controller 930 performs arbitration between the functional signal and the diagnostic signal in dependence upon priority information associated with those signals is to situations where a cached processor is being traced and/or debugged using the integrated circuit. The processor produces instruction trace data fastest when running from code stored in an instruction cache and produces instruction trace data more slowly when it needs to fetch instructions from external memory. When running from code in the cache, no external memory instruction fetches are needed. Thus the available external memory bandwidth can be used to communicate diagnostic data in such circumstances. When the processor is fetching instructions from external memory there is less free external memory bandwidth for use in communication of diagnostic data, but trace data is produced more slowly in this case. As external memory instruction-fetch bandwidth increases, instruction trace output decreases and as external memory instruction bandwidth decreases instruction trace output increases.

The arrangement of FIG. 9 makes use of the ChipSelect memory control signal to indicate when the address and control signals are available for communication of diagnostic data. Alternative arrangements use knowledge of the bus protocol associated with the signal communication path to determine when other signals are not being used.

Figure 10:
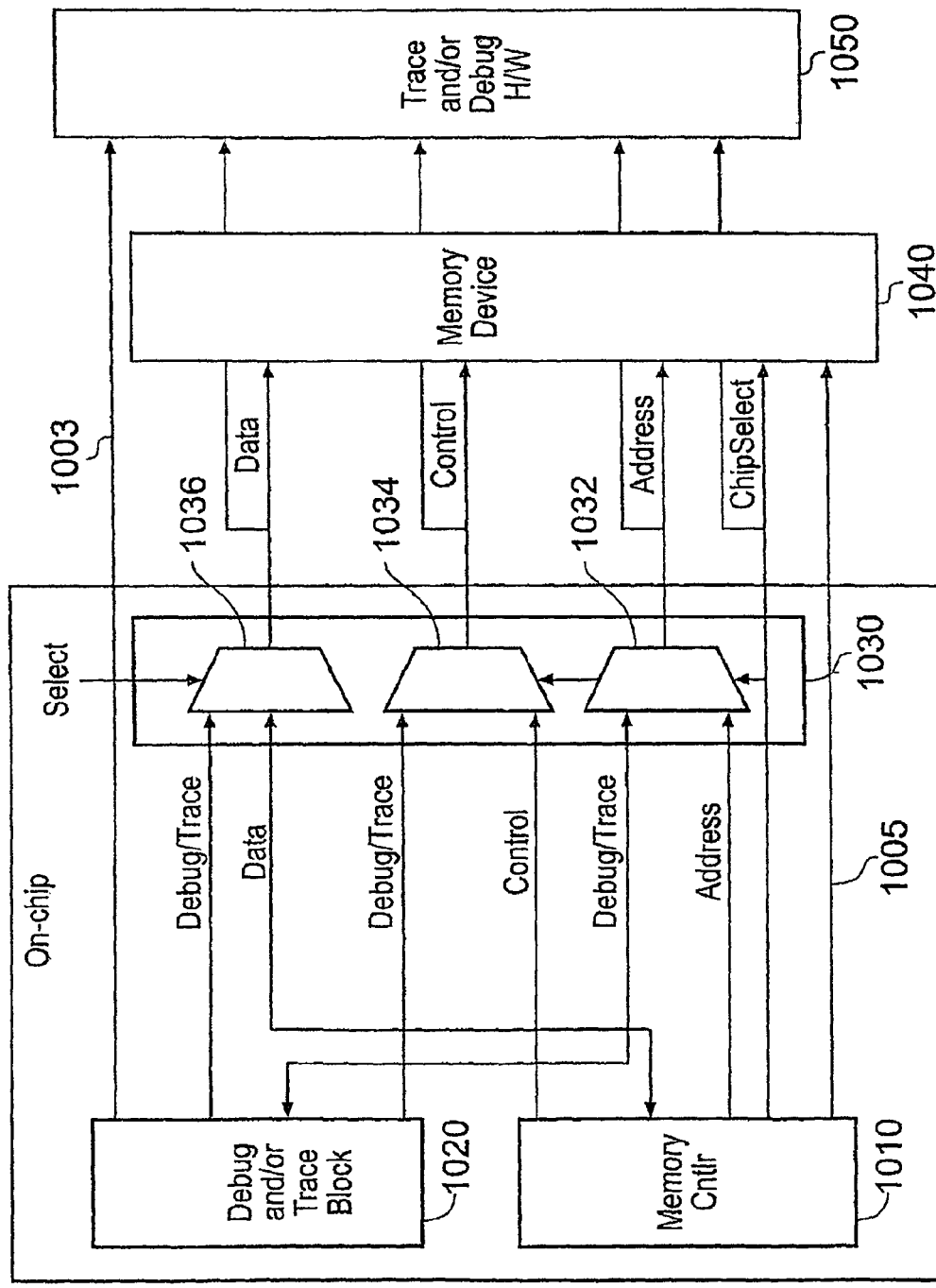

FIG. 10 schematically illustrates an integrated circuit for time division multiplexing diagnostic data and functional data similar to the arrangement of FIG. 9, but in which some signals bypass the multiplexers of the signal interface controller 930. The arrangement of FIG. 10 comprises: an integrated circuit having a memory controller 1010, am on-chip debug/trace block 1020 and a signal interface controller 1030 with a trio of multiplexers 1032, 1034, 1036; an external memory device 1040 and external trace/debug hardware 1050.

It can be seen that the arrangement of FIG. 10 is very similar to the arrangement of FIG. 9 with the exception that a dedicated signal path 1003 is provided between the on-chip debug/trace block 1020 and the external trace/debug hardware 1050. A further direct communication channel 1005, which avoids the trio of multiplexers of the signal interface controller 1030, is provided between the memory controller 1010 and the external memory 1040 and this dedicated channel can be used to perform memory management operations such as memory refresh. The separate dedicated channels 1003, 1005 can be used for example to ensure that critical data is not lost in the event that there is insufficient bandwidth available on the common signal interface for the diagnostic data and the functional data.

Figure 11:
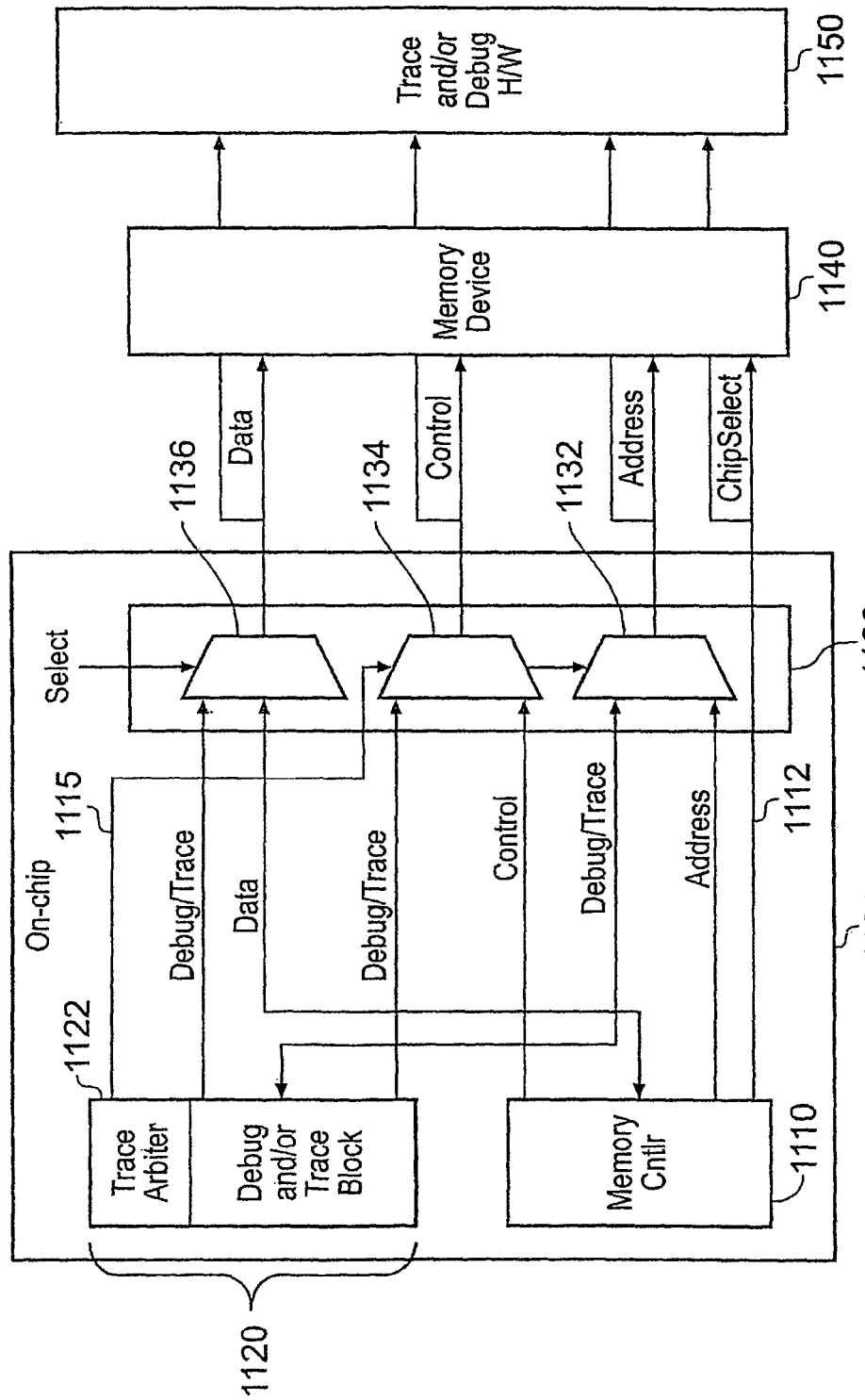

FIG. 11 is an integrated circuit for time division multiplexing of a functional signal and a diagnostic signal similar to the arrangement of FIG. 9, but in which the on-chip debug/trace block comprises a trace arbiter. The arrangement of FIG. 11 comprises: an integrated circuit 1100 having a memory controller 1010, an on-chip debug/trace block 1120 and a signal interface controller 1130 with a trio of multiplexers 1132, 1134, 1136; an external memory device 1140 and external trace/debug hardware 1150. In particular, the on-chip debug/trace block 1120 of FIG. 11 differs from the debug/trace block 920 of FIG. 9 in that it comprises trace arbiter circuitry 1122. An output control signal 1115 from the trace arbiter circuitry 1122 is used to control the address and control multiplexers 1132, 1134, of the signal interface controller 1130. As for FIGS. 9 and 10, a separate select signal controls the data multiplexer 1136. This separate select signal 1117 is supplied to the data multiplexer 1136 from the trace arbiter 1122. In the FIG. 11 arrangement the ChipSelect signal 1112 does not control the address multiplexer 1132 or the control multiplexer 1134. Rather, the ChipSelect signal 1112 is supplied directly to the external devices 1140, 1150. The arrangement of FIG. 11 provides for efficient handling of large volumes of diagnostic data (e.g. trace data) since the trace arbiter can monitor the volume of trace data produced (which can be handled in dependence upon the available bandwidth on the common signal interface) and control on-chip buffering of any trace data that cannot be directly output via the common signal interface. Furthermore, in the arrangement of FIG. 11 the state of the memory controller 1110 can be captured and frozen whilst the trace arbiter 1122 copes with any excess trace data. This prevents inadvertent loss of trace data when the common signal interface has insufficient bandwidth to cope with the current volume of both data communication between the memory controller 1110 and the external memory device 1140 and between the on-chip debug/trace block 1120 and the external trace/debug hardware 1150.

Figure 12:
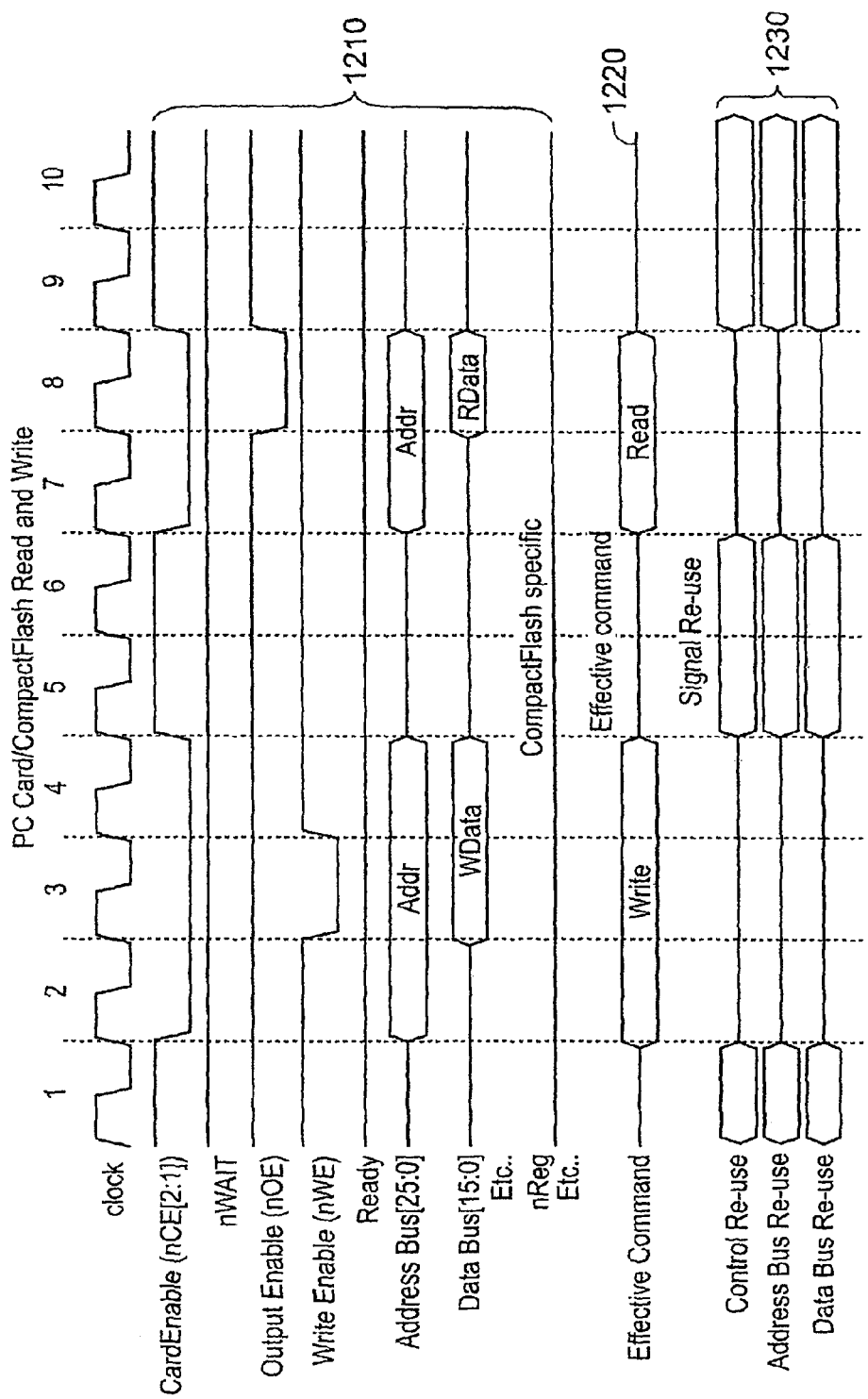
FIG. 12 is a signal diagram schematically illustrating how control signals associated with a memory controller and a non-volatile external memory device are used to control selective communication.

FIG. 12 schematically illustrates signal diagrams for time division multiplexing a diagnostic signal and a functional signal in the apparatus of FIG. 3 where the external memory device 322 is a non-volatile memory device (e.g. a PC card or compact flash card). FIG. 12 shows ten clock cycles and associated control signals for the non-volatile memory device. The control signals differ slightly from the control signals of FIGS. 5-8. In particular, there is no chip select signal, but instead there is a card enable signal. It can be seen that the card enable signal is low for clock periods 2-4 and 7-8.

Memory data is output on the data bus with a one clock cycle delay relative to the clock cycles that the corresponding memory addresses are output on the address bus and control bus. The address output on the address bus during clock cycles 2-4 corresponds to a write to the non-volatile memory device 322 (of FIG. 3) and the corresponding write data is output on the data bus in clock cycles 3 and 4. The address output on the address bus during clock cycles 7 and 8 corresponds to a read from the non-volatile memory device 322 and the read data is output on the data bus during clock cycle 8. The group of control signals 1210 can be used either individually or in combinations thereof to control time division multiplexing of the functional signal and the diagnostic signal across the common signal interface.

The effective commands are represented by signal line 1220 in FIG. 12, which shows that the write command spans clock cycles 2-4 whereas the read command spans clock cycles 7 and 8. The signal re-use pattern is shown by the group of signals 1230 and it can be seen that the control bus, the address bus and the data bus all have identical re-use patterns in this case. These buses can be re-used for transmission of diagnostic data in the clock cycles that are not used for performing the write operation and the read operation so that clock cycles 1, 5-6, 9-10 can be used to transmit diagnostic data.

Figure 13:
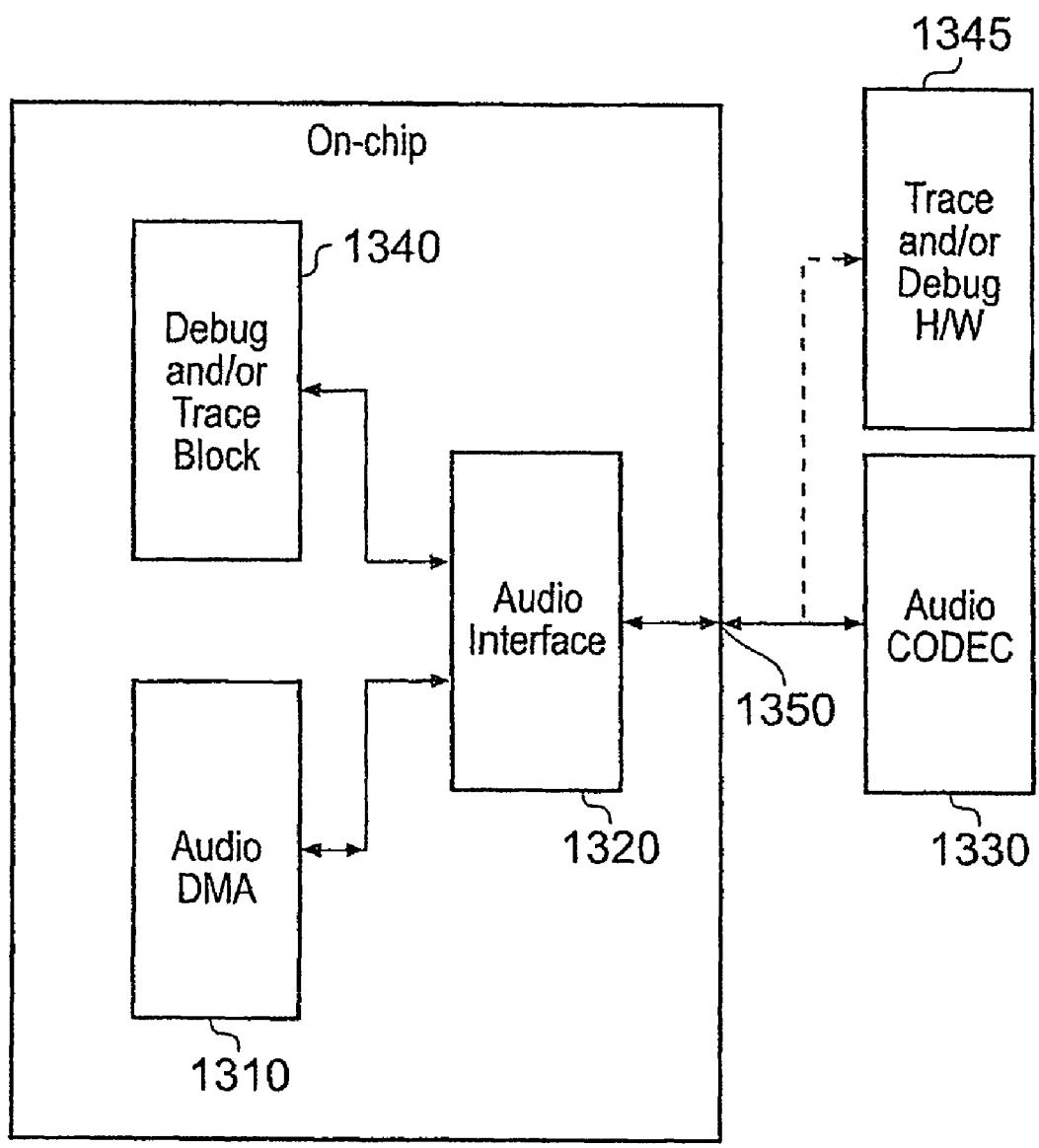
FIG. 13 schematically illustrates an integrated circuit for time division multiplexing an audio signal and a diagnostic signal.

FIG. 13 schematically illustrates an integrated circuit operable to selectively combine (by time-division multiplexing) functional data and diagnostic data in the case where the functional circuit is an audio processing circuit. The integrated circuit 1300 comprises: an audio direct memory access (DMA) circuit; an audio interface 1320; an external audio codec 1330; an on-chip debug/trace block 1340 and an external trace/debug hardware unit 1345.

The audio DMA circuit 1310 exchanges data bi-directionally with the external audio codec 1330 via the on-chip audio interface 1320. A common signal interface 1350 is provided for communication of audio data and communication of diagnostic data. Diagnostic data is communicated bi-directionally between the on-chip debug/trace block 1340 and the external trace/debug hardware 1345. Both the functional signal and the diagnostic signal are routed to the audio interface 1320, which monitors at least one signal associated with the audio DMA 1310 and/or the on-chip debug/trace block 1340. The audio interface controls time division multiplexing on the signal interface in dependence upon the monitored signal(s). In alternative arrangements, the codec sample resolution of the audio codec is reduced to make more bits available on the interface for communication of diagnostic data.

Figure 14:
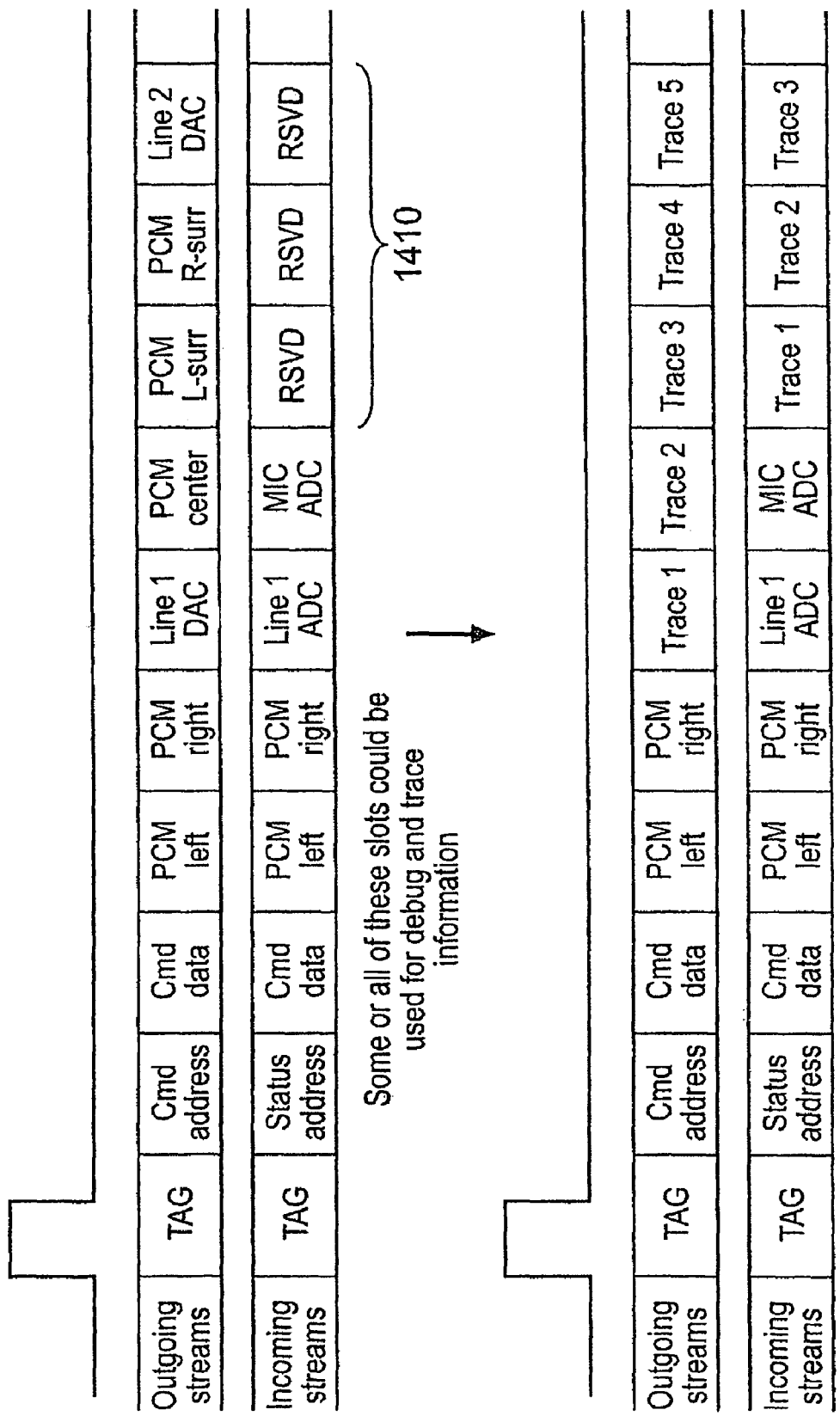
FIG. 14 schematically illustrates how time division multiplexing of an audio signal and a diagnostic signal are performed in the case of a known audio protocol.

FIG. 14 schematically illustrates an AC97 AC-link serial interface audio protocol used by the audio DMA 1310 and audio interface 1320 of FIG. 13. The audio protocol has a number of predetermined timeslots which associated uses. For example outgoing audio data streams comprise the following allocations: a timeslot for receiving a command address, a timeslot for receiving a command data and five different pulse code modulated (PCM) audio channels comprising a left channel, a right channel, a centre channel, left-surround (L-surr) and right-surround (R-surr) on outgoing streams. The incoming streams have a slightly different format and comprise, for example, a status address timeslot, command data, left and right PCM channels and three reserved timeslots 1410. The signal interface controller of FIG. 13 (in this case the audio interface 1320) is operable to use some or all of these timeslots for communication of debug and trace information between the on-chip debug/trace block 1340 and the external trace/debug hardware 1350. In this particular example, the time division multiplexing has been controlled such that outgoing audio streams (functional signals) have been restricted to two PCM audio channels (left and right) and three samples of trace data (trace 2, trace 3, trace 4) have been inserted in the timeslots associated with PCM centre L-surround and R-surround. Trace data has also been inserted in the Line 1 DAC and line 2 DAC timeslots of the outgoing audio streams. In the incoming streams, the reserve timeslots (RSVD) of the audio protocol have been used to communicate trace data from the external trace/debug hardware 1350 to the on-chip debug/trace block 1340.

Although in this embodiment the diagnostic data samples are inserted in predetermined timeslots of the audio protocol (i.e. audio data and diagnostic data are time-division multiplexed), in alternative embodiments the diagnostic data is communicated by replacing data corresponding to low-order audio bits of individual audio samples. One such embodiment is described below with reference to FIG. 17. The result of this is that there will be some disturbance to the audio signal as a result or transmission of the diagnostic data but the disruption caused to the audio signal due to communication of the diagnostic data will typically be within tolerable limits (in terms of the ability of the user to detect any disturbance) due to the fact that low-order bits are used.

In alternative embodiments to the embodiment of FIG. 13 the integrated circuit comprises a functional circuit operable to process video data. The video data is communicated to an external video processing circuit via a signal interface that is also used for communication of diagnostic data in a similar manner to the common signal interface 1350 of FIG. 13. In the case of the video data, data of the diagnostic signal is time division multiplexed with the video signal by outputting diagnostic data during periods when video information is not output (e.g. the horizontal and/or vertical blanking/sync interval). Alternatively, the diagnostic data is inserted in low-order video bits (see FIG. 17 below) corresponding to portions of the video image where noise in the signal is likely to be less observable to viewers of the image.

Figure 15:
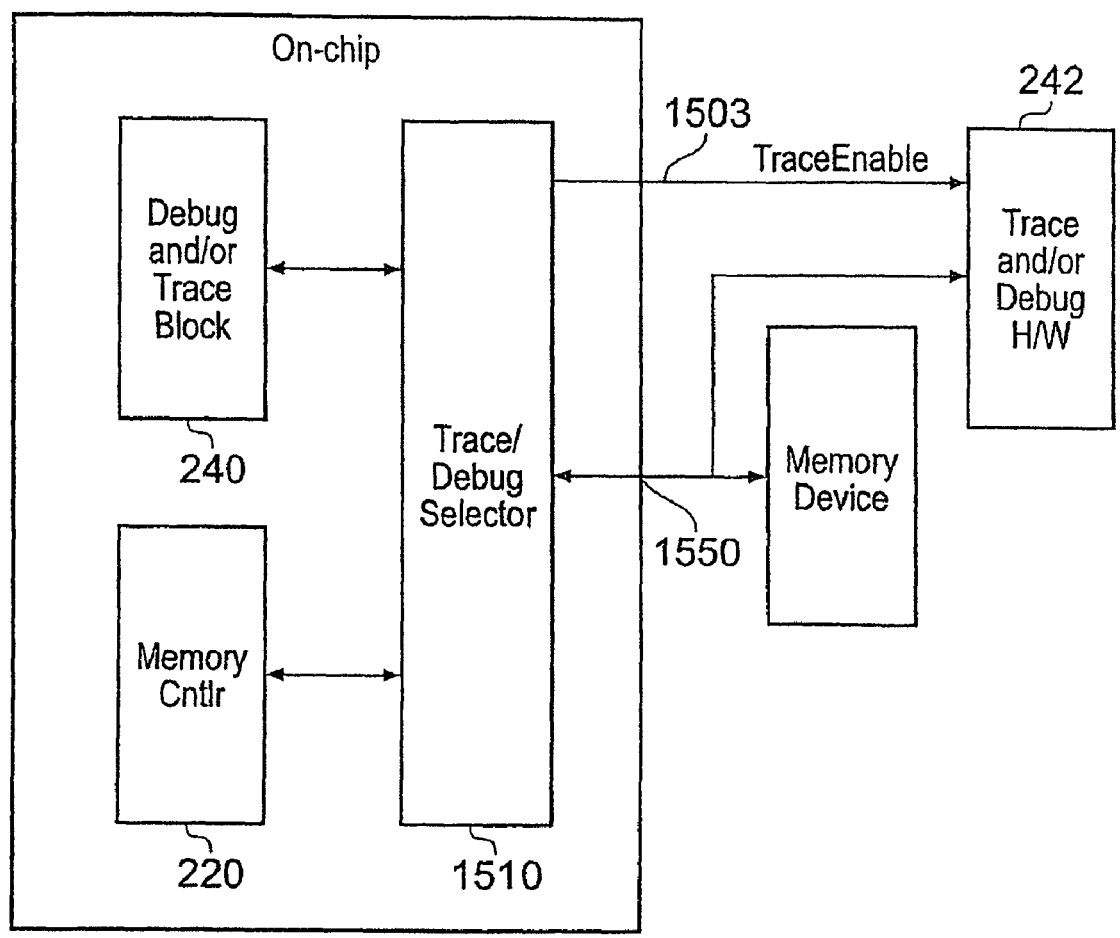
FIG. 15 and FIG. 16 schematically illustrate how the integrated circuit indicates to external equipment whether the diagnostic signal or the control signal is being communicated on the signal interface.

FIG. 15 schematically illustrates an integrated circuit for time division multiplexing functional data and diagnostic data, which illustrates how the external trace/debug hardware recognises when diagnostic data is being communicated across the common signal interface 1550. This arrangement is similar to the embodiment of FIG. 2 where the memory controller 220 and the on-chip debug/trace block 240 separately provide signals to an arbitration block (230 in FIG. 2), which in this case is the arbitration block 1510. The arbitration block 1510 comprises circuitry for generating a dedicated trace enable signal 1503, which is supplied via a dedicated integrated circuit pin to the external trace/debug hardware 242. This trace enable signal 1503 is used to indicate when a debug/trace signal is being communicated across the common interface 1550. It will be appreciated that in alternative arrangements to that of FIG. 15, the trace enable signal can be generated by different circuits on the integrated circuit, for example, the trace enable signal could be generated by the memory controller 320 in the embodiment of FIG. 3.

Figure 16:
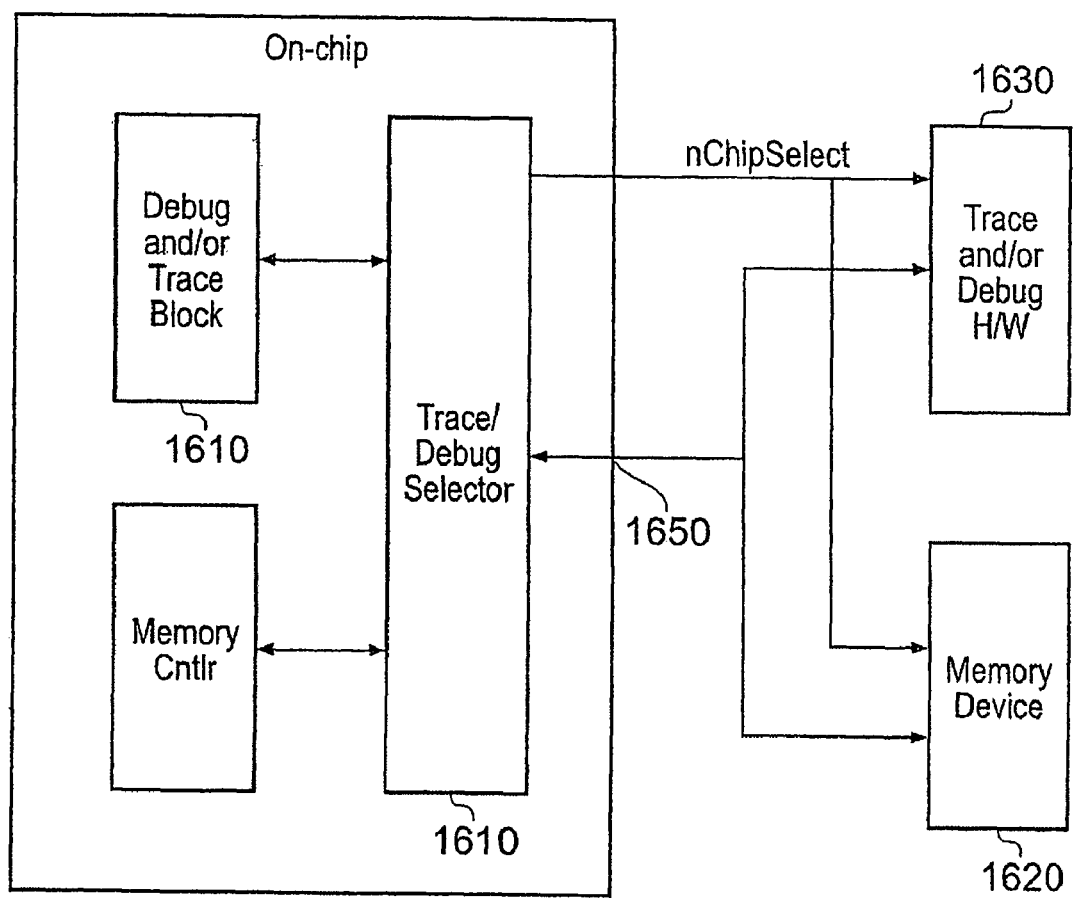

FIG. 16 schematically illustrates an alternative way of indicating to external trace/debug hardware that trace/debug data is being communicated across a common signal interface. In this case, an arbitration block 1610 that controls the common signal interface 1650 uses standard control signals (in this case the nChipSelect signal) to indicate when debug/trace data is being communicated across the common interface between the on-chip debug/trace block 1610 and the external trace/debug hardware 1630. In this case the external memory device 1620 is selected (i.e. data associated with memory transactions is being communicated across the common interface) when the nChipSelect signal is low, whereas the external debug/trace component 1630 is selected (i.e. diagnostic data is communicated across the signal interface) when the nChipSelect signal is high. Both the external trace/debug hardware 1630 and the external memory device 1620 are responsive to the nChipSelect signal. The external devices use the nChipSelect signal to demultiplex the time-division multiplexed signal that is communicated across the common signal interface 1650. Hence the external trace/debug hardware 1630 uses the nChipSelect signal to extract the diagnostic signal and the external memory device uses the nChipSelect signal to extract the functional signal for subsequent processing.

Use of either the dedicated trace enable signal or the nChipSelect signal to indicate to the external equipment whether functional data or diagnostic data is transmitted enables the external equipment to appropriately handle information being communicated on the common signal interface on which the functional signal and the diagnostic signal are time division multiplexed. An alternative scheme requires the external trace/debug hardware to monitor the signal interface. The external trace/debug hardware uses information with regard to previous and current control signal activations to determine when buses will be available for transfer of diagnostic data.

The external equipment need only identify which data is diagnostic data and need not distinguish between functional data and idle time. However, in some arrangements the external equipment can identify functional data and respond appropriately to idle time e.g. by disregarding the idle time.

Figure 17:
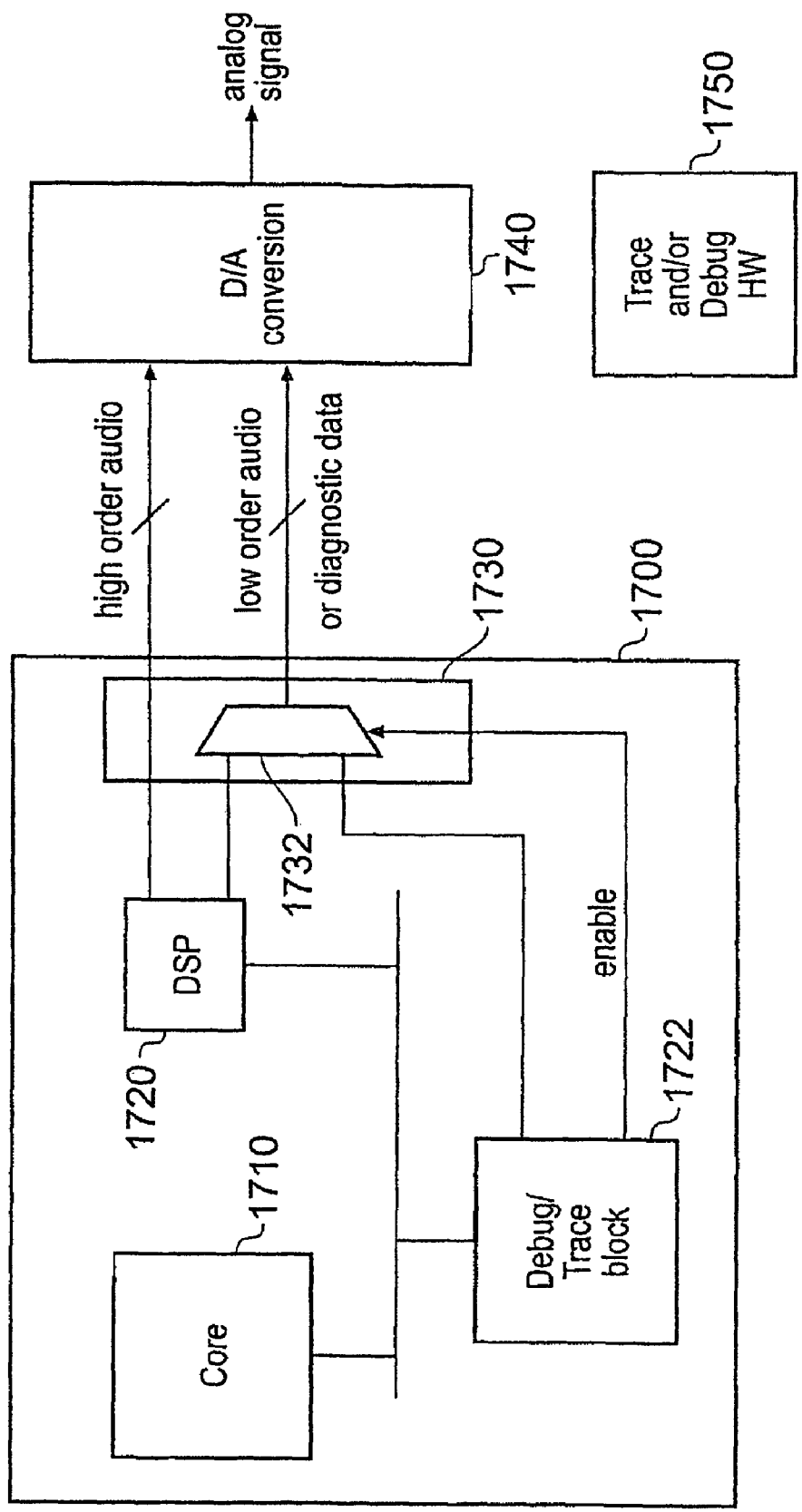
FIG. 17 schematically illustrates an arrangement in which low order bits of an audio signal are replaced by diagnostic data when selectively communicating a functional signal and a diagnostic signal.

FIG. 17 schematically illustrates an integrated circuit in which an audio signal and a diagnostic signal are communicated using a single signal interface by inserting diagnostic data in low-order bits of the audio signal. The arrangement comprises an integrated circuit 1700 having a core 1710, a digital signal processor (DSP) 1720, an on-chip debug/trace block 1722 and a signal interface controller 1730 including a multiplexer 1732. The integrated circuit 1700 communicates with a digital to analogue (D/A) conversion circuit 1740. An external trace/debug hardware unit 1750 is provided.

The digital signal processor outputs a functional signal comprising multi-bit audio data samples (multi-bit values) but separates the multi-bit samples into a signal comprising high-order audio bits and a signal comprising low-order audio bits. The high-order audio bits are supplied directly to the D/A conversion unit 1740 whereas the low-order audio bits are supplied to the multiplexer 1732 within the signal interface controller 1730. The multiplexer 1732 also receives data from the on-chip debug/trace block 1722 and outputs either the low-order audio bits or diagnostic data.

The multiplexer 1732 is controlled by an enable signal generated by the on-chip debug/trace block 1722. When the on-chip debug/trace block 1722 outputs diagnostic data the low order audio bits of the audio signal are replaced by the multiplexer 1732 for at least some of the time. However when there is no diagnostic data to output or when the diagnostic data has sufficiently low priority relative to the audio data, both the high order audio bits and the low order audio bits are supplied to the D/A conversion unit 1740 and the diagnostic signal is not communicated across the signal interface.

The output of the multiplexer 1732 is supplied as input to the external trace/debug hardware unit 1750 which separates diagnostic data from the low order audio bits signal and processes (i.e. analyses or forwards for analysis) the diagnostic data.

The D/A conversion unit 1740 converts the (demultiplexed) digital audio signal received from the integrated circuit 1700 to an analogue signal for output.

Although in FIG. 17, the high-order audio data and the low-order audio data/diagnostic data are communicated in parallel (e.g. using separate circuit pins of the signal interface for low-order bits and for high-order bits) across the signal interface, in alternative arrangements the high-order and low-order audio data are communicated serially across the signal interface, sequentially over a single pin interface. In such alternative arrangements, the external trace/debug hardware 1750 has a state machine. The state machine is used to determine whether a given bit is a low-order or a high-order bit. The state machine also determines whether individual low-order bits correspond to functional data or diagnostic data.

Replacement of low-order bits of the functional signal can be performed when the functional signal is a physical signal representing a physical entity or in any other situation where omission of data bits does not significantly impair the function performed by the functional circuitry.

For the purposes of this description time division multiplexing is considered to include at least sending a plurality of signals along a single communication path such that different signals are transferred apparently simultaneously as sub-channels within a single communication channel but in some sense take turns on the channel. Either fixed-length timeslots or variable-length timeslots can be used.

In the case of the arrangement of FIG. 17 it is clear that the diagnostic data is inserted in the low order audio bits when the signal interface controller 1730 determines that it is appropriate to do so. Thus the diagnostic signal is not necessarily transmitted simultaneously with the functional signal but instead is output in dependence upon whether the on-chip debug/trace block is currently generating data and whether the signal interface controller 1730 determines that it is appropriate to replace the low order audio bits by the diagnostic data. Thus the diagnostic signal effectively takes a turn on the common communication channel and complies with the definition of time division multiplexing provided above.

However, it is noted that the arrangement of FIG. 17 can be implemented such that no time division multiplexing is performed, but instead, the low-order bits of the functional data are invariably replaced by diagnostic data. Thus, for example, in a debug mode of a data processing system, one or more low-order bits of a given multi-bit functional data value are always replaced by diagnostic data.

In further alternative arrangements, bits other than low-order bits of a multi-bit data value are replaced by diagnostic data. FIG. 17 relates to a functional signal that is an audio signal, but an alternative arrangement uses a video signal as the functional signal and replaces low-order bits of the video signal. Indeed bits other than low-order bits of a functional signal can be replaced. For example, bits of multi-bit video samples can be replaced by diagnostic data when it is determined that replacement of those bits will be less perceptible to the viewer (bits corresponding to certain portions of an image).

In yet a further alternative embodiment, the functional signal is a data signal associated with a memory interface. In this alternative arrangement the memory interface provides the capacity (via e.g. a bus) to specify more memory addresses than can be supported by a given external memory. This is likely to apply, for example, when a given bus is provided to support a plurality of possible external memory devices having different specifications. In cases where a multi-bit value supplied to an external memory comprises "surplus" bits not required for controlling functional operation of the memory device, these bits are used for communication of diagnostic data. Thus, the replacement of one or more bits of a multi-bit value by diagnostic data according to the present technique is applicable to functional data other than audio signals and video signals. Furthermore, rather than replacing one or more bits of a multi-bit value of functional data by diagnostic data, alternative arrangements replace one or more bits of a multi-bit value of diagnostic data by functional data.

Although particular embodiments of the invention have been described herein, it will be apparent that the invention is not limited thereto, and that many modifications and additions may be made within the scope of the invention. For example, various combinations of the features of the following dependent claims could be made with features of the independent claims without departing from the scope of the present invention.

In so far as the embodiments of the invention described above are implemented at least in part, using software controlled data processing apparatus, it will be appreciated that a computer providing such software control and a transmission, storage or other medium by which such a computer program is provided are envisaged as aspects of the present invention.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
a functional processing circuit for processing a functional signal comprising at least one multi-bit value;
a diagnostic circuit for processing a diagnostic signal;
a signal interface providing a communication path between said integrated circuit and at least one external device;
a signal interface controller configured to control communication of said diagnostic signal and said functional signal across said signal interface and to replace at least one bit of said multi-bit value by data of said diagnostic signal with at least one other bit of said multi-bit value unchanged.

2. Integrated circuit according to claim 1, wherein said at least one replaced bit corresponds to one or more low-order bits of said multi-bit value.

3. Integrated circuit according to claim 1, wherein said signal interface controller controls parallel communication across said signal interface.

4. Integrated circuit according to claim 1, wherein said signal interface controller controls serial communication across said signal interface.

5. Integrated circuit according to claim 1, wherein said functional signal is an audio signal.

6. Integrated circuit according to claim 1, wherein said functional signal is a video signal.

7. Integrated circuit according to claim 1, wherein said signal interface controller performs time division multiplexing of said functional signal and said diagnostic signal.

8. A data processing method for use on an integrated circuit, said method comprising the steps of:
processing a functional signal comprising at least one multi-bit value;
processing a diagnostic signal;
providing a communication path between an integrated circuit and at least one external device;
controlling communication of said diagnostic signal and said functional signal across said communication path and replacing at least one bit of said multi-bit value by data of said diagnostic signal with at least one other bit of said multi-bit value unchanged.

* * * * *